US 10,498,372 B2

(12) United States Patent
Pratt

(10) Patent No.: US 10,498,372 B2
(45) Date of Patent: *Dec. 3, 2019

(54) MIXED-MODE DIGITAL PREDISTORTION

(71) Applicant: Analog Devices Global, Hamilton (BM)

(72) Inventor: Patrick Pratt, Mallow (IE)

(73) Assignee: Analog Devices Global, Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 16/024,303

(22) Filed: Jun. 29, 2018

(65) Prior Publication Data

US 2018/0309465 A1    Oct. 25, 2018

Related U.S. Application Data

(63) Continuation of application No. 15/159,532, filed on May 19, 2016, now Pat. No. 10,033,413.

(51) Int. Cl.
*H04B 1/04* (2006.01)
*H03F 1/32* (2006.01)
*H03F 3/195* (2006.01)

(52) U.S. Cl.
CPC ......... *H04B 1/0475* (2013.01); *H03F 1/3247* (2013.01); *H03F 1/3294* (2013.01);
(Continued)

(58) Field of Classification Search
CPC .............. H03F 1/3247; H03F 1/3294; H03F 2201/3233; H03F 3/24; H03F 1/3241;
(Continued)

(56) References Cited

U.S. PATENT DOCUMENTS 4,470,020 A    9/1984 Mohr
4,970,470 A    11/1990 Gosser
(Continued)

FOREIGN PATENT DOCUMENTS

CN    102427438 A    4/2012
EP    1560329 A1    8/2005
(Continued)

OTHER PUBLICATIONS

"U.S. Appl. No. 15/159,492, Corrected Notice of Allowance dated Dec. 20, 2017", 2 pgs.

(Continued)

*Primary Examiner* — James M Perez
(74) *Attorney, Agent, or Firm* — Schwegman Lundberg & Woessner, P.A.

(57) ABSTRACT

Various examples are directed to systems and methods for digital predistortion (DPD). A linear digital predistortion (DPD) circuit may be programmed to generate a pre-distorted signal linear component based at least in part on a complex baseband signal. A nonlinear DPD circuit may be programmed to generate a pre-distorted signal nonlinear component based at least in part on the complex baseband signal. A mixer circuit programmed to generate a pre-distorted signal based at least in part on the pre-distorted signal linear component and the pre-distorted signal nonlinear component.

20 Claims, 20 Drawing Sheets

(52) U.S. Cl.
CPC ....... *H03F 3/195* (2013.01); *H03F 2200/451* (2013.01); *H03F 2201/3227* (2013.01); *H03F 2201/3233* (2013.01); *H04B 2001/0425* (2013.01)

(58) Field of Classification Search
CPC ............ H04L 27/368; H04L 25/03343; H03G 3/3042
USPC .................................................. 375/295–297
See application file for complete search history.

(56) References Cited

U.S. PATENT DOCUMENTS

| | | | | |
|---|---|---|---|---|
| 5,049,832 A * | 9/1991 | Cavers | ................. | H03F 1/3247 330/149 |
| 5,123,732 A | 6/1992 | Gross et al. | | |
| 6,081,158 A * | 6/2000 | Twitchell | ............... | H03F 1/3247 330/149 |
| 6,314,142 B1 * | 11/2001 | Perthold | ............... | H03F 1/3247 375/296 |
| 6,342,810 B1 * | 1/2002 | Wright | ................. | H03F 1/3241 330/124 D |
| 6,587,514 B1 * | 7/2003 | Wright | ................. | H03F 1/3241 330/149 |
| 6,600,792 B2 * | 7/2003 | Antonio | ............... | H03F 1/3241 330/149 |
| 6,630,862 B1 * | 10/2003 | Perthold | ............... | H03F 1/3241 330/136 |
| 6,798,282 B1 | 9/2004 | Broekaert et al. | | |
| 6,798,843 B1 * | 9/2004 | Wright | ................. | H03F 1/3241 330/149 |
| 7,058,369 B1 * | 6/2006 | Wright | ................. | H01Q 1/243 375/297 |
| 7,139,326 B2 * | 11/2006 | Maulik | ................. | H03C 3/40 375/296 |
| 7,418,056 B2 * | 8/2008 | Suzuki | ................. | H03F 1/3247 375/296 |
| 7,460,613 B2 * | 12/2008 | Sahlman | ............... | H03F 1/3247 375/296 |
| 7,466,197 B2 | 12/2008 | Benedict et al. | | |
| 7,542,519 B2 * | 6/2009 | McCallister | ......... | H04B 1/0075 330/149 |
| 7,551,905 B2 | 6/2009 | Kubo et al. | | |
| 7,724,840 B2 * | 5/2010 | McCallister | ......... | H03F 1/3247 330/149 |
| 7,796,960 B1 * | 9/2010 | Rashev | ............. | H04L 25/03063 455/114.3 |
| 8,238,849 B2 * | 8/2012 | Pratt | .................... | H03F 1/3247 330/149 |
| 8,306,149 B2 * | 11/2012 | Mujica | .................. | H03F 1/3247 375/296 |
| 8,351,876 B2 | 1/2013 | Mccallister et al. | | |
| 8,401,108 B1 * | 3/2013 | Haddadin | ................ | H03C 1/00 375/295 |
| 8,433,263 B2 * | 4/2013 | Pratt | .................... | H03F 1/3247 330/149 |
| 8,502,567 B2 | 8/2013 | Lawas | | |
| 8,605,819 B2 * | 12/2013 | Lozhkin | ............... | H03F 1/3247 375/295 |
| 8,649,743 B2 | 2/2014 | Mccallister et al. | | |
| 8,842,769 B2 * | 9/2014 | Morris | ................. | H03D 7/161 375/295 |
| 8,909,175 B1 * | 12/2014 | McCallister | .......... | H04L 27/368 330/127 |
| 8,948,293 B2 * | 2/2015 | Onggosanusi | ......... | H04B 7/024 375/284 |
| 8,948,301 B2 * | 2/2015 | Rollins | ................. | H04L 27/368 375/296 |
| 8,958,504 B2 * | 2/2015 | Warke | ................ | H04L 27/0014 375/235 |
| 9,048,900 B2 * | 6/2015 | Pratt | ........................ | H04B 1/10 |
| 9,071,487 B2 * | 6/2015 | Pratt | ................ | H04L 25/03828 |
| 9,184,710 B2 * | 11/2015 | Braithwaite | .......... | H03F 1/3247 |
| 9,210,009 B2 * | 12/2015 | Pashay-Kojouri | ...... | H03F 3/193 |
| 9,252,821 B2 * | 2/2016 | Shor | .................... | H04B 1/0475 |
| 9,276,617 B2 * | 3/2016 | Schafferer | ................ | H03F 1/30 |
| 9,374,044 B2 * | 6/2016 | Jian | ........................ | H03H 11/04 |
| 9,484,962 B1 * | 11/2016 | Magesacher | .......... | H03F 1/3241 |
| 9,614,557 B1 * | 4/2017 | Mayer | .................... | H04B 17/13 |
| 9,628,119 B2 * | 4/2017 | Gal | ........................ | H04B 1/0475 |
| 9,628,120 B2 * | 4/2017 | Yu | ........................ | H04B 1/0475 |
| 9,641,206 B2 * | 5/2017 | Pratt | .................... | H04B 1/0475 |
| 9,735,741 B2 * | 8/2017 | Pratt | .................... | H03F 1/3247 |
| 9,813,223 B2 * | 11/2017 | Azadet | ................. | G06F 17/5009 |
| 9,893,748 B2 * | 2/2018 | Ye | .......................... | H04L 25/49 |
| 10,033,413 B2 * | 7/2018 | Pratt | .................... | H04B 1/0475 |
| 10,056,924 B2 * | 8/2018 | Schafferer | .............. | H03M 1/74 |
| 10,067,171 B2 * | 9/2018 | O'Keeffe | ............... | G01R 29/10 |
| 10,090,940 B2 * | 10/2018 | O'Keeffe | ............... | H01Q 3/267 |
| 10,193,603 B2 * | 1/2019 | O'Keeffe | ............... | H01Q 1/246 |
| 10,224,970 B2 * | 3/2019 | Pratt | .................... | H04B 1/0475 |
| 2002/0101937 A1 * | 8/2002 | Antonio | ................ | H03F 1/3241 375/297 |
| 2003/0179831 A1 * | 9/2003 | Gupta | .................... | H03F 1/3247 375/296 |
| 2004/0116083 A1 * | 6/2004 | Suzuki | ................. | H03F 1/3247 455/126 |
| 2004/0266369 A1 * | 12/2004 | McCallister | ......... | H04B 1/0475 455/115.1 |
| 2005/0001684 A1 * | 1/2005 | Braithwaite | .......... | H03F 1/3247 330/263 |
| 2005/0163251 A1 * | 7/2005 | McCallister | .......... | H03F 1/3247 375/296 |
| 2005/0163268 A1 * | 7/2005 | McCallister | .......... | H03F 1/3247 375/346 |
| 2005/0231279 A1 * | 10/2005 | Moffatt | ................. | H03F 1/3247 330/149 |
| 2006/0109930 A1 * | 5/2006 | O'Sullivan | ........... | H03F 1/3247 375/296 |
| 2007/0082617 A1 * | 4/2007 | McCallister | ......... | H04B 1/0475 455/63.1 |
| 2007/0254592 A1 * | 11/2007 | McCallister | .......... | H03F 1/0205 455/67.11 |
| 2008/0144709 A1 * | 6/2008 | McCallister | .......... | H03F 1/3247 375/233 |
| 2008/0285640 A1 * | 11/2008 | McCallister | ...... | H04L 25/03044 375/233 |
| 2009/0097590 A1 * | 4/2009 | McCallister | .......... | H03F 1/0261 375/296 |
| 2009/0124218 A1 * | 5/2009 | McCallister | .......... | H03F 1/3247 455/114.2 |
| 2009/0227215 A1 * | 9/2009 | McCallister | .......... | H03F 1/0211 455/114.3 |
| 2009/0274035 A1 * | 11/2009 | Siaud | .................... | H04L 1/0071 370/208 |
| 2009/0280758 A1 * | 11/2009 | Pratt | .................... | H03G 3/3047 455/127.2 |
| 2009/0316838 A1 * | 12/2009 | Fuller | ................ | H04L 27/0014 375/340 |
| 2010/0098191 A1 * | 4/2010 | Morris | ................... | H03C 1/547 375/322 |
| 2010/0172437 A1 * | 7/2010 | Brown | .................. | H03F 1/3294 375/296 |
| 2010/0248658 A1 * | 9/2010 | Pratt | .................... | H03F 1/3247 455/114.3 |
| 2011/0080216 A1 | 4/2011 | Mujica et al. | | |
| 2011/0092173 A1 * | 4/2011 | McCallister | .......... | H03F 1/3247 455/108 |
| 2011/0135034 A1 * | 6/2011 | Mujica | .................. | H03F 1/3247 375/296 |
| 2011/0270590 A1 * | 11/2011 | Aparin | ............... | G06K 9/00496 703/2 |
| 2012/0007672 A1 * | 1/2012 | Peyresoubes | ......... | H03F 1/3247 330/149 |
| 2012/0034886 A1 | 2/2012 | Mccallister et al. | | |
| 2012/0034887 A1 * | 2/2012 | McCallister | .......... | H03F 1/3247 455/127.1 |
| 2013/0166259 A1 * | 6/2013 | Weber | ................. | G06F 17/5009 703/2 |

(56) References Cited

U.S. PATENT DOCUMENTS

| | | | | |
|---|---|---|---|---|
| 2014/0086356 | A1* | 3/2014 | Azadet | H04L 1/0054 375/295 |
| 2014/0269988 | A1* | 9/2014 | Schafferer | H03F 1/30 375/296 |
| 2014/0362949 | A1* | 12/2014 | Pratt | H04B 1/0475 375/296 |
| 2015/0016567 | A1* | 1/2015 | Chen | H04B 1/0475 375/297 |
| 2015/0043678 | A1* | 2/2015 | Hammi | H04B 1/0475 375/297 |
| 2015/0162881 | A1* | 6/2015 | Hammi | H03F 3/189 330/291 |
| 2015/0171878 | A1* | 6/2015 | Schafferer | H03M 1/74 375/297 |
| 2015/0256216 | A1* | 9/2015 | Ding | H04B 1/62 375/297 |
| 2015/0288399 | A1* | 10/2015 | Pratt | H04L 23/00 455/296 |
| 2015/0318880 | A1* | 11/2015 | Rexberg | H03F 1/3247 375/297 |
| 2015/0381216 | A1* | 12/2015 | Shor | H04B 1/0475 375/297 |
| 2016/0087657 | A1* | 3/2016 | Yu | H04B 1/0475 375/297 |
| 2016/0191020 | A1* | 6/2016 | Velazquez | H03H 21/0067 341/118 |
| 2016/0204809 | A1* | 7/2016 | Pratt | H04B 1/04 375/219 |
| 2016/0294601 | A1* | 10/2016 | Frederick | H04W 4/80 |
| 2016/0308577 | A1* | 10/2016 | Molina | H04B 1/62 |
| 2016/0352290 | A1* | 12/2016 | Gavert | H03F 1/3247 |
| 2017/0033809 | A1* | 2/2017 | Liu | H04B 1/04 |
| 2017/0104503 | A1* | 4/2017 | Pratt | H04B 1/0475 |
| 2017/0141736 | A1* | 5/2017 | Pratt | H03F 3/21 |
| 2017/0207802 | A1* | 7/2017 | Pratt | H04B 1/04 |
| 2017/0237455 | A1* | 8/2017 | Ye | H04L 25/49 455/114.3 |
| 2017/0338841 | A1* | 11/2017 | Pratt | H04B 1/0475 |
| 2017/0338842 | A1* | 11/2017 | Pratt | H04B 1/0475 |
| 2018/0027427 | A1* | 1/2018 | McCallister | H04B 17/336 375/227 |
| 2018/0309465 | A1* | 10/2018 | Pratt | H04B 1/0475 |

FOREIGN PATENT DOCUMENTS

| | | |
|---|---|---|
| TW | 201605166 A | 2/2016 |
| WO | WO-0001065 A1 | 1/2000 |

OTHER PUBLICATIONS

"U.S. Appl. No. 15/159,492, Examiner Interview Summary dated Apr. 25, 2017", 3 pgs.
"U.S. Appl. No. 15/159,492, Examiner Interview Summary dated Dec. 22, 2017", 3 pgs.
"U.S. Appl. No. 15/159,492, Non Final Office Action dated Jan. 12, 2017", 7 pgs.
"U.S. Appl. No. 15/159,492, Notice of Allowance dated Feb. 6, 2018", 10 pgs.
"U.S. Appl. No. 15/159,492, Notice of Allowance dated May 22, 2017", 6 pgs.
"U.S. Appl. No. 15/159,492, Notice of Allowance dated Jun. 27, 2018", 5 pgs.
"U.S. Appl. No. 15/159,492, Notice of Allowance dated Sep. 15, 2017", 5 pgs.
"U.S. Appl. No. 15/159,492, Preliminary Amendment filed Jan. 8, 2018", 11 pgs.
"U.S. Appl. No. 15/159,492, PTO Response to Rule 312 Communication dated Dec. 28, 2017", 3 pgs.
"U.S. Appl. No. 15/159,492, Response filed May 2, 2017 to Non Final Office Action dated Jan. 12, 2017", 14 pgs.
"U.S. Appl. No. 15/159,532, Examiner Interview Summary dated Aug. 7, 2017", 3 pgs.
"U.S. Appl. No. 15/159,532, Final Office Action dated Nov. 16, 2017", 9 pgs.
"U.S. Appl. No. 15/159,532, Non Final Office Action May 4, 2017", 10 pgs.
"U.S. Appl. No. 15/159,532, Notice of Allowance dated Mar. 26, 2018", 14 pgs.
"U.S. Appl. No. 15/159,532, Response filed Feb. 16, 2018 to Final Office Action dated Nov. 16, 2017", 11 pgs.
"U.S. Appl. No. 15/159,532, Response filed Aug. 4, 2017 to Non Final Office Action dated May 4, 2017", 13 pgs.
"European Application Serial No. 17168399.8, European Search Report dated Jul. 11, 2017", 9 pgs.
Gilabert, Pere L., et al., "Chapter 8—Look-up table based digital predistortion schemes and implementation", Digital Front-End in Wireless Communication—Circuits and Signal Processing, Luo, Fa-Long, Editor, (2011), 214-243.
"U.S. Appl. No. 15/159,492, Notice of Allowance dated Oct. 23, 2018", 5 pgs.
"European Application Serial No. 17168399.8, Communication Pursuant to Article 94(3) EPC Jul. 29, 2019", 5 pgs.
"Taiwanese Application Serial No. 106114946, Office Action dated Apr. 10, 2018", w/ English translation, 10 pgs.

* cited by examiner

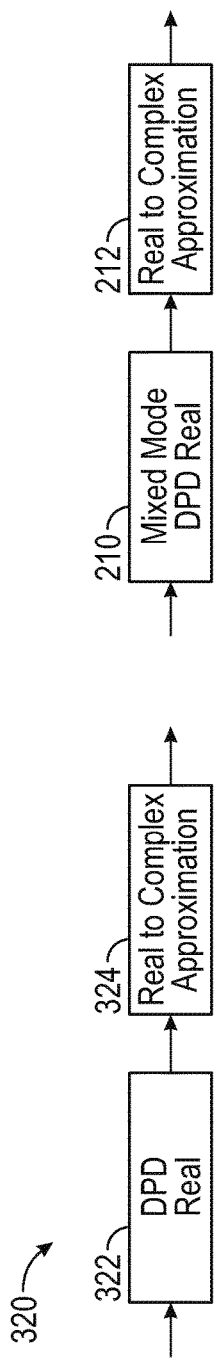
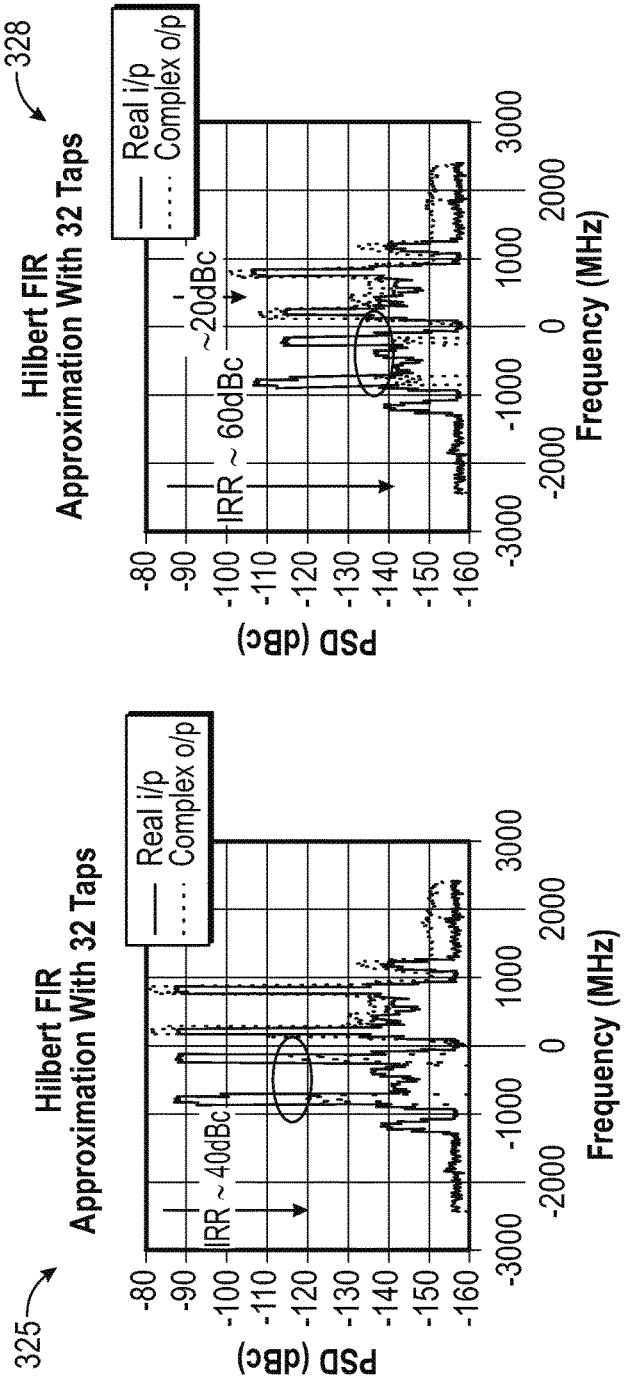
FIG. 10A
FIG. 10B

MIXED-MODE DIGITAL PREDISTORTION

CLAIM OF PRIORITY

This application is a continuation of U.S. patent application Ser. No. 15/159,532, filed May 19, 2016, which is hereby incorporated by reference in its entirety.

TECHNICAL FIELD

This document pertains generally, but not by way of limitation, to integrated circuits and communication systems, and particularly, but not by way of limitation to digital predistortion for power amplifiers.

BACKGROUND

Radiofrequency (RF) communications, such as for mobile telephony, may use an RF power amplifier (PA) circuit in an RF transmitter to produce the RF signal for transmission over the air to an RF receiver. The PA circuit may have a nonlinear gain characteristic, such as gain compression occurring at higher power output levels, which can lead to signal distortion at such higher power levels.

U.S. Pat. No. 6,342,810, for example, mentions a method of compensating for amplifier nonlinearities by using predistortion to apply an inverse model of the amplifier's transfer characteristic to an input signal of the amplifier. A goal of such predistortion is to reduce distortion due to the PA circuit gain nonlinearity.

SUMMARY

The present inventors have recognized, among other things, that allowing a power amplifier (PA) circuit to operate including in its nonlinear (e.g., gain compression) region, such as by using predistortion compensation, can provide one or more benefits, such as to improve amplifier efficiency and performance, reduce power consumption, reduce waste heat generation, and reduce or avoid the need for active or passive cooling of the PA circuit, but that using the PA circuit with wideband input signals may present additional challenges that that can increase distortion and noise in a PA circuit.

A PA circuit operated at least in part in its nonlinear region produces distortions across a wide frequency band. For example, when a PA circuit is used to amplify a carrier-modulated input signal, the PA circuit generates distortion terms centered at the carrier frequency and at harmonics of the carrier frequency. When the input signal has a bandwidth that is less than the carrier frequency, predistortion compensation may be used to correct for distortion terms centered at the carrier frequency, while distortion terms at the carrier frequency harmonics are removed by low-pass filtering. When the input signal is a wideband or ultrawide band signal with a bandwidth similar to or larger than the carrier frequency, however, the input signal frequency band may overlap with distortion terms at one or more of the carrier frequency harmonics. This may make it may difficult to use low-pass filtering to remove distortion terms without also degrading the input signal.

Among other things, this document explains how predistortion compensation can be used to correct distortion terms at the carrier frequency and to correct distortion terms at one or more carrier frequency harmonics. For example, the input signal may be and/or be converted to a complex signal (e.g., a complex baseband signal). A linear digital predistortion (DPD) circuit may receive the complex baseband signal and generate a pre-distorted signal linear component. A nonlinear DPD circuit may convert the complex baseband signal to a real signal and generate a pre-distorted signal nonlinear component from the real signal.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIGS. 10A and 10B show a real-mode DPD circuit configured to process linear terms and a real DPD circuit and real-to-complex circuit.

DETAILED DESCRIPTION

U.S. patent application Ser. No. 15/159,532, entitled "WIDEBAND DIGITAL PREDISTORTION," and filed concurrently herewith is incorporated herein by reference in its entirety.

Figure 1:
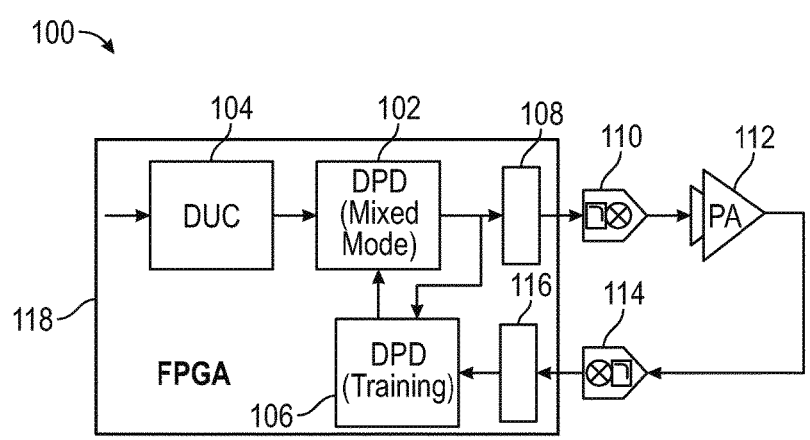
FIG. 1 shows an example of a power amplifier (PA) system with mixed mode digital predistortion (DPD).

FIG. 1 shows an example of a power amplifier (PA) circuit 100 with mixed mode digital predistortion (DPD). The circuit 100 may be utilized in different applications including, for example, for RF transmission, such as cellular network transmissions, and/or for transmissions through a cable (e.g., a coaxial cable) of a cable television network or similar network. A mixed mode digital predistortion (DPD) circuit 102 may receive as an input signal a complex baseband signal $\tilde{x}$. (Digital Upconverter (DUC) 104, which may be positioned upstream of the DPD circuit 102, is described in more detail below.) The complex baseband signal $\tilde{x}$ may be a complex or analytic signal having a real component and a quadrature component. The DPD circuit 102 may generate a pre-distorted complex baseband signal $\tilde{v}$. The pre-distorted complex baseband signal $\tilde{v}$ may be provided to a digital-to-analog converter (DAC) 110 (e.g., via a communications link 108). In some examples, the DAC 110 may also modulate the pre-distorted complex baseband signal $\tilde{v}$ to a carrier frequency $f_c$ to generate a transmission signal v, although in other examples a separate up-converter component may be used. The transmission signal v may be provided to a power amplifier 112, such as for wireless or wired transmission.

A DPD adaptation or training circuit 106 may train the DPD circuit 102, for example, as described herein. An output of the PA 112 may be sampled by an analog-to-digital converter (ADC) 114 to generate a feedback signal y. In the example shown in FIG. 1, the ADC 114 also down-converts the sampled output of the PA 112 to baseband, although in other examples a separate down-converter component may be used. The ADC 114 may provide the feedback signal y to the DPD training circuit 106, (e.g., via the communications link 116). The DPD training circuit 106 may also receive the pre-distorted complex baseband signal $\tilde{v}$ (and/or a real signal v generated by the DPD circuit 102). Based on the pre-distorted complex baseband signal $\tilde{v}$ and the complex baseband feedback signal $\tilde{y}$ the DPD adaptation circuit 106 may generate and/or update the DPD circuit 102. Additional examples for training the DPD circuit 102 are described herein.

In the example of FIG. 1, the complex baseband signal $\tilde{x}$ is received by the DPD circuit 102 from a digital up-converter (DUC) 104. The DUC 104 may be used in various applications, such as cable applications. For example, the DUC 104 may receive a set of channel signals. Each channel signal may be a complex signal centered at baseband. In some cable television applications, each channel signal represents one television channel. The DUC 104 may stack the channel signals to generate the complex baseband signal. In a simple example, the DUC 104 receives four channel signals, each having a bandwidth B, and each centered at a frequency B/2. The first channel signal may remain centered at B/2. The DUC 104 may translate the second channel signal to generate a translated second channel signal centered at 3 B/2. The DUC 104 may translate the third channel signal to generate a translated third channel signal centered at 5 B/2 and may translate the fourth channel signal to generate a translated fourth channel signal centered at 7 B/2. The DUC 104 may combine the first channel signal, the translated second channel signal, the translated third channel signal, and the translated third channel signal to generate the complex baseband signal. The resulting complex baseband signal may have a bandwidth of 4 B. Although this example includes four channel signals, more or fewer channel signals may be acted on by the DUC 104. Also, although the channel input signals received by the DUC 104 are described as being received at the DUC 104 in complex baseband, in some examples, the DUC 104 may receive real channel signals and convert the real channel signals to the complex baseband signal output. Also, in some examples, the output of the DUC 104 may be expressed as a real signal and may be converted to complex form by a subsequent circuit component. In some examples, the DUC 104 is omitted.

The example of FIG. 1 shows a configuration of the circuit 100 implemented utilizing a Field Programmable Gate Array (FPGA) 118. For example, the DUC 104, DPD circuit 102, and DPD training circuit 106 are shown implemented by the FPGA 118. Components or modules not implemented by the FPGA 118 in FIG. 1 may be implemented using any other suitable hardware. The communications links 108, 116 shown in FIG. 1 may be used to facilitate communications between the FPGA 118 and the various other components of the circuit 100. The communications links 108, 116 may be configured according to any suitable protocol, such as the JESD204 serial protocol. Although the communications links 108, 116 are shown on the FPGA 118, in some examples, communications protocols 108, 116 may be implemented with different hardware components. Also, in some examples, the DPD adaptation circuit 106 may be implemented off of the FPGA 118, such as at a separate digital signal processor (DSP) (not shown). For example, the DPD adaptation circuit 106 may train the DPD circuit 102 at a clock rate slower than the operation of the DPD circuit 102 allowing the DPD adaptation circuit 106 to be implemented on a slower DSP rather than the FPGA 118.

Figure 2:
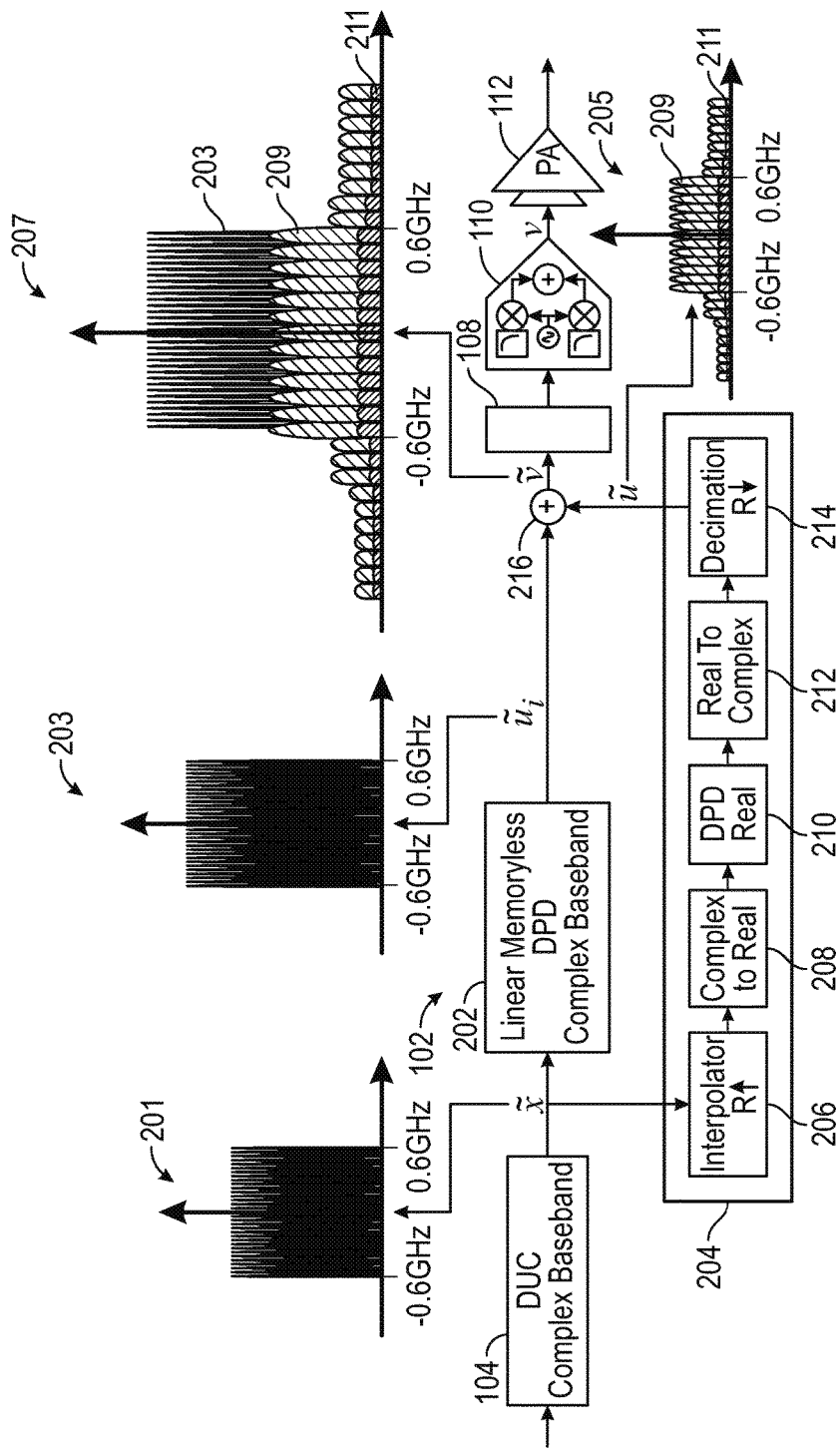
FIG. 2 shows one example of the PA circuit of FIG. 1 showing additional details of the mixed mode DPD circuit.

FIG. 2 shows an example of the PA circuit 100 of FIG. 1 showing additional details of the mixed mode DPD circuit 102. The DPD circuit 102 may comprise a linear DPD circuit 202 and a nonlinear DPD circuit 204. The linear DPD circuit 202 may operate in complex mode at baseband. The linear DPD circuit 202 may receive the complex baseband signal $\tilde{x}$ and provide as output a pre-distorted signal linear component $\tilde{u}_l$, which may also be a complex signal at baseband. In some examples, the linear DPD circuit 202 may apply a scalar gain to the complex baseband signal $\tilde{x}$. Additional details of the nonlinear DPD circuit 204 are provided herein, for example, with reference to FIG. 11.

In some examples, use of separate linear and nonlinear DPD circuits, as described herein may provide several advantages. For example, real-mode processing of the nonlinear correction terms by the nonlinear DPD circuit 204 may enable the correction of wide bandwidth complex baseband signals. In some examples, wide bandwidth complex baseband signals may include complex baseband signals having a bandwidth that is about equal to the carrier frequency and/or complex baseband signals where the lower band edge is less than or equal to about half of the upper band edge and/or at or close to direct current (DC) (e.g., f=0). For example, real-mode processing at the nonlinear DPD circuit 204 may provide correction for multiple distortion orders across multiple harmonic frequency zones of the carrier frequency. On the other hand, performing linear processing in complex mode may enable the nonlinear DPD circuit 204 to utilize a simpler real-to-complex converter, for example, with a simpler filter design, as described herein.

The nonlinear DPD circuit 204 may also receive the complex baseband signal x̃ and provide as output a pre-distorted nonlinear component ũ. The pre-distorted nonlinear component ũ may be a complex signal at baseband. The pre-distorted signal linear component ũ$_l$ and the pre-distorted nonlinear component ũ may be added at a summer circuit 216, resulting in the pre-distorted signal ṽ, which may also be a complex signal at baseband. In some examples, such as cable implementations, the pre-distorted signal ṽ may be decimated or otherwise of its sample rate dropped to the same rate as the complex baseband signal x̃, for example, to facilitate transmittal via the communication link 108. The nonlinear DPD circuit 204 may operate in real mode and, in some examples, at the carrier frequency $f_c$. For example, the nonlinear DPD circuit 204 may comprise circuits for converting the complex baseband signal x̃ to real mode, modulating the complex baseband signal x̃ to the carrier frequency $f_c$ and/or performing other processing. FIG. 2 shows various constituent circuits of the nonlinear DPD circuit 204 including an interpolator circuit 206, a complex-to-real converter circuit 208, a real DPD circuit 210, a real-to-complex circuit 212, and a decimator circuit 214.

FIG. 2 also includes plots of examples of the various signals in the circuit 100. A plot 201 shows one example of the complex baseband signal x̃. In the example of FIG. 2, the complex baseband signal x̃ has a bandwidth of about 1.2 GHz, extending from −0.6 GHz to 0.6 GHz. A plot 203 shows an example of the pre-distorted signal linear component ũ$_l$. In some examples, the pre-distorted signal linear component ũ$_l$ may have the same bandwidth as the complex baseband signal x̃. For example, the plot 203 shows the pre-distorted signal linear component ũ$_l$ with a bandwidth of about 1.2 GHz, extending from −0.6 GHz to 0.6 GHz, similar to the plot 201 of the example complex baseband signal ũ. A plot 205 shows one example of the pre-distorted non-linear component ũ. The pre-distorted nonlinear component ũ may include pre-distorted content 209 that may be in the bandwidth of the complex baseband signal x̃, although some of the pre-distorted content 209 may be out-of-band. The pre-distorted nonlinear component ũ may also comprise distortion and/or aliasing components 211. As described herein in more detail with reference to FIG. 9, the distortion content 211 and out-of-band portions of the pre-distorted content 209 may fall below the noise floor of the DAC 110 and/or PA 112 and therefore maybe ignored and/or filtered.

Figure 3:
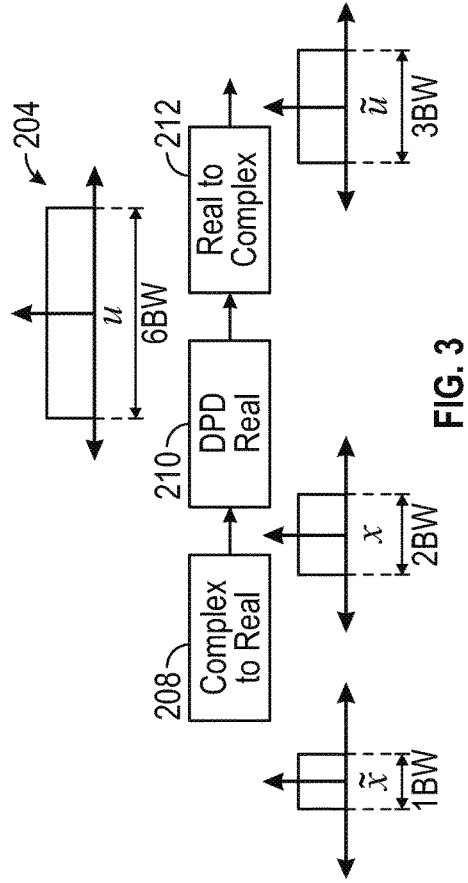
FIG. 3 is a diagram showing bandwidth expansion in an example of the nonlinear DPD circuit.

FIG. 3 is a diagram showing bandwidth expansion in an example of the nonlinear DPD circuit 204. FIG. 3 shows the complex-to-real circuit 208, the real DPD circuit 210, and the real-to-complex circuit 212 of the nonlinear DPD circuit 204. The complex baseband signal x̃ may have an initial bandwidth indicated in FIG. 3 as BW. The initial bandwidth may be any suitable bandwidth. For example, the initial bandwidth may be a wideband or ultrawideband bandwidth within an order of magnitude of the carrier frequency $f_c$. In the example of FIG. 2, the plot 201 of the complex baseband signal x̃ has an initial bandwidth of 1.2 GHz, although complex baseband signals of other bandwidths may be used.

The various components of the nonlinear DPD circuit 204 may expand and contract the bandwidth of the processed signals. Converting the complex baseband signal x̃ to real mode at complex-to-real circuit 208 may generate a real signal x with double the original bandwidth BW, or 2 BW. The real signal x, in some examples, may be translated to the carrier frequency $f_c$ prior to processing by the real DPD circuit 210. For example, converting the complex baseband signal x̃ to real mode may introduce negative frequency content that can double the original bandwidth BW. The real DPD circuit 210 may further expand the bandwidth of the real signal x. For example, the pre-distorted nonlinear component u may have a bandwidth greater than the bandwidth of the real signal x by a factor equal to the highest order distortion term compensated by the real DPD circuit 210. In the example of FIG. 3, the highest order distortion term to be compensated is of the $3^{rd}$ order. Accordingly, the real DPD circuit 210 may generate a pre-distorted nonlinear component u with a bandwidth of about three times the bandwidth of the real signal x, or about 6 BW. Conversion of the pre-distorted nonlinear component u to a complex pre-distorted nonlinear component ũ may halve the bandwidth from 6 BW to 3 BW.

Bandwidth expansion in the nonlinear DPD circuit 204 may increase the desirable sample frequency $f_s$ in the circuit 204. The sample frequency $f_s$ (also sometimes referred to as the sample rate) may refer to the number of samples n of the various signals per unit time. Under the Nyquist theorem, the maximum signal frequency that can be accurately reconstructed from a digital signal is equal to the sampling frequency $f_s$, for complex signals, and equal to ½ of the sampling frequency ($f_s/2$) for real signals. Accordingly, if the bandwidth of the signals processed by the nonlinear DPD circuit 204 is expanded to include frequency content at greater than the Nyquist frequency, then aliasing and/or other distortion may be introduced unless the sample frequency $f_s$ (and hence the Nyquist frequency) is also increased. Referring again to FIG. 2, the interpolator circuit 206 may be configured to increase the sampling frequency $f_s$ of the complex baseband signal F to allow for bandwidth expansion in the nonlinear DPD circuit 204 without excessive aliasing or distortion. The interpolator circuit 206 may increase the sampling frequency to two times the highest expected frequency content. In various examples, the highest expected frequency content in the nonlinear DPD circuit may be highest order distortion term to be corrected. For example, if the highest order distortion term to be corrected is three (e.g., $3^{rd}$ order), the interpolator circuit 206 may increase the sampling frequency by a factor of 2*3, or 6. In some examples, distortion terms with an order higher than a selected order (e.g., the $3^{rd}$ order) may drop off significantly in magnitude so as to be below the noise floor of the PA circuit 100. Accordingly, in some examples, the interpolator circuit 206 may be configured to increase the sampling frequency of the complex baseband signal x̃ by a factor of six (6), or other suitable order, even if higher order distortion terms are to be considered. The interpolator circuit 206 and/or decimation circuit 214 may be implemented using any suitable technology such as, for example, Cascaded Integrator-Comb (CIC) or Hogenauer filtering, half-band filtering, polyphase filtering, etc.

Figure 4:
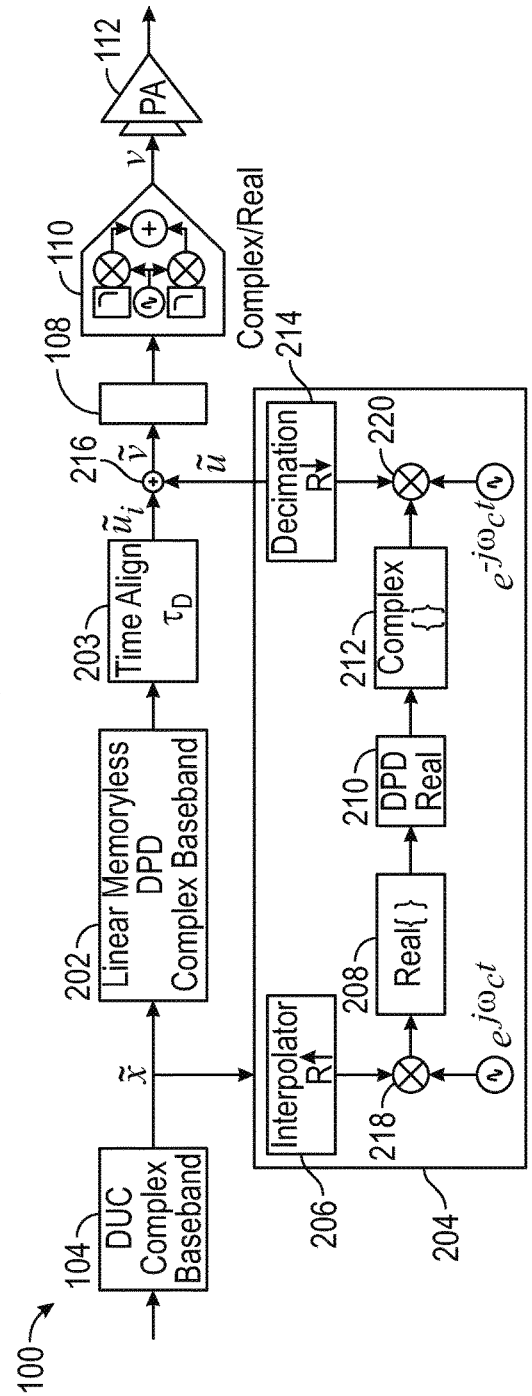
FIG. 4 is a diagram of an example of the PA circuit of FIG. 1 including additional details of the nonlinear DPD circuit.

FIG. 4 is a diagram of an example of the PA circuit 100 including additional details of the nonlinear DPD circuit 204. In the example of FIG. 4, the nonlinear DPD circuit 204 may include a real DPD circuit 210 that operates at the carrier frequency $f_c$. Accordingly, the complex baseband signal x̃ may be translated to the carrier frequency $f_c$ at a mixer 218 to generate a translated complex signal. Up-conversion may be accomplished, for example, by multiplying the complex baseband signal x̃ by a complex representation of the carrier frequency, given by [1]:

$$e^{j\omega_c t} \qquad [1]$$

In [1], $\omega_c$ may be the angular representation of the carrier frequency $f_c$. For example, $\omega_c$ may be equal to $2\pi f_c$. Before being summed with the pre-distorted signal linear component $\tilde{u}_l$, the pre-distorted nonlinear component $\tilde{u}$ may be translated back to baseband. For example, the pre-distorted nonlinear component $\tilde{u}$ at the carrier frequency $f_c$ may be multiplied by a complex inverse representation of the carrier frequency, given by [2]:

$$e^{-j\omega_c t} \qquad [2]$$

In FIG. 4, translation to the carrier frequency occurs after the interpolator circuit 206 and prior to the decimator circuit 214. In some examples, however, translating may occur prior to the interpolator circuit 206 and/or translating may occur after the decimator circuit 214.

Figure 5:
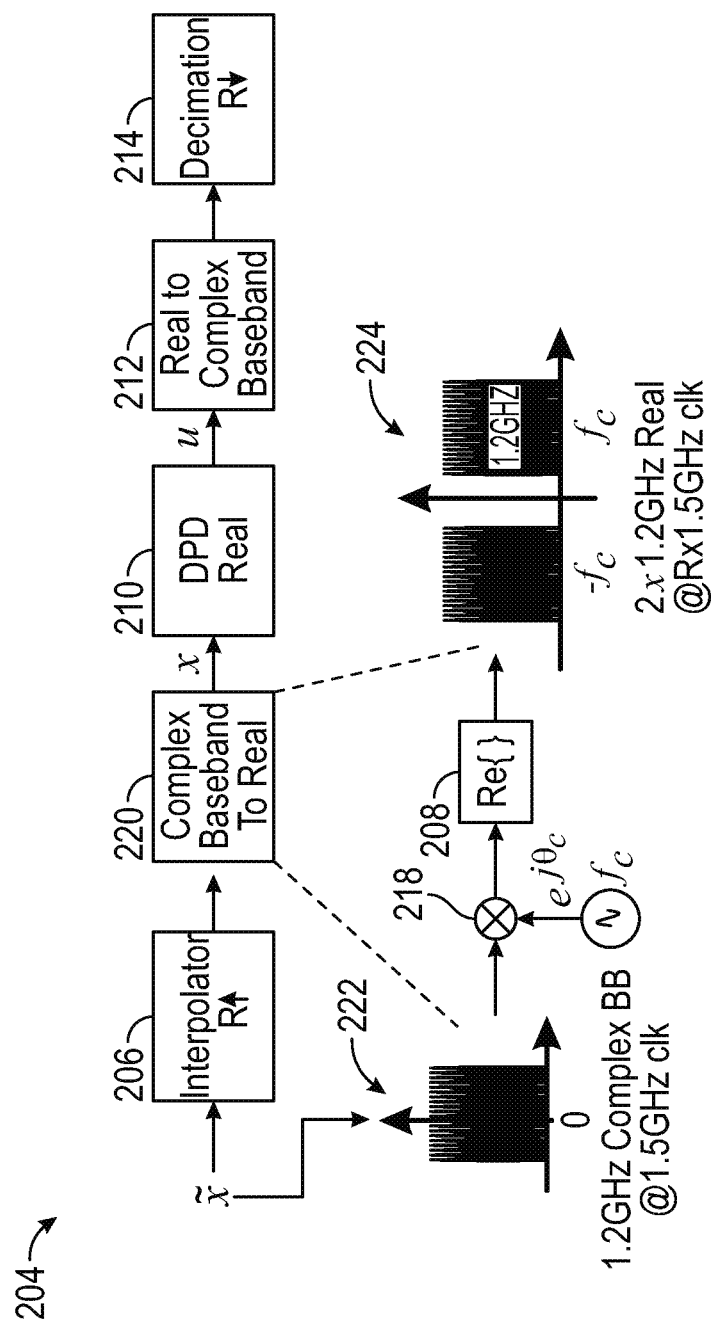
FIG. 5 is a diagram showing an example of the nonlinear DPD circuit including additional details of the complex-to-real circuit.

FIG. 5 is a diagram showing an example of the nonlinear DPD circuit 204 including additional details of the complex-to-real circuit 208. In the example of FIG. 5, the complex-to-real circuit 208 and the mixer 218 are combined into a complex baseband-to-real circuit 212. FIG. 5 includes a plot 222 showing one example of the complex baseband signal $\tilde{x}$. The example plot 222, similar to the example plot 201, has a bandwidth of 1.2 GHz centered at DC. Mixer 218 may translate the complex baseband signal $\tilde{x}$ to the carrier frequency, resulting in a 1.2 GHz bandwidth signal centered at $f_c$. The complex-to-real circuit 208 may generate the real signal x, which may have a 1.2 GHz frequency component centered at $f_c$ and a 1.2 GHz frequency component centered at $-f_c$ as shown by plot 224.

Figure 6:
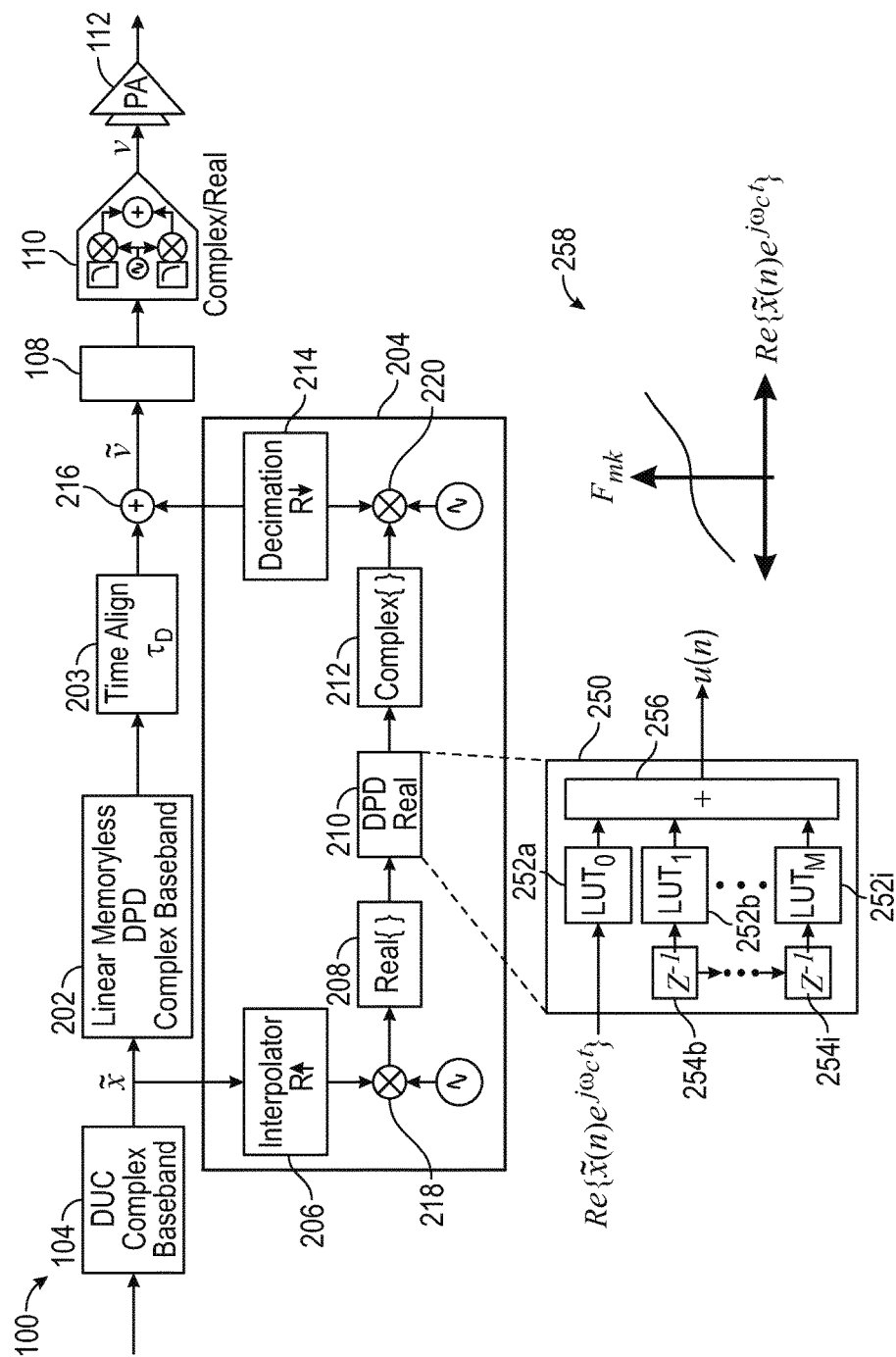
FIG. 6 is a diagram showing an example of the PA circuit of FIG. 1 showing the real DPD circuit implemented with a look-up table (LUT) bank.

FIG. 6 is a diagram showing an example of the PA circuit 100 showing the real DPD circuit 210 implemented with a look-up table (LUT) bank 250. The real DPD circuit 210, as described herein, may receive a real signal x(n) that is a real component of the complex baseband signal $\tilde{x}$ translated to the carrier frequency $f_c$, for example, represented by [3]:

$$x(n) = \mathcal{R}e\{\tilde{x}(n)e^{j\omega_c t}\} \qquad [3]$$

The LUT bank 250 may comprise M LUTs 252a, 252b, 252i, where M is the memory depth of the LUT bank 250. For example, the LUT bank 250 may determine a value x(n) at a first sample n. The value may be used as an index to select a value from a first LUT 252a. The value for x(n) may be provided to a cascade of delay circuits 254b, 254i, which may generate delayed values of x that may be provided to LUTs 252b, 252i at different memory levels. For example, the output of LUT 252b may be based on x(n−1) and the output of LUT 252i may be based on x(n−M). The values for each of the M+1 LUTs 252a, 252b, 252i may be summed at summer 256 to yield the pre-distorted nonlinear component u. Example values for the LUTs as a function of x(n) are shown by a plot 258.

A general expression for a DPD pre-distorted signal may be given by Equation [4] below:

$$v(n) = \Sigma_{m=0}^{M} \Sigma_{k=0}^{K} h_k(m) x(n-m)^k \qquad [4]$$

Equation [4] represents a memory polynomial approximation of a general Volterra series. In some examples, the Volterra series itself, or other suitable approximations may be used. In Equation [4], v is the pre-distorted signal, M is the memory depth, $h_k(m)$ is a coefficient of the memory polynomial or other model of the distortion caused by the PA 112. The coefficient $h_k(m)$ may be a function of k, which is the order of the term corrected, and m, which is the memory depth. M may be the highest memory depth of the correction, and K may be the highest order distortion term to be corrected. From Equation [4], a one dimensional look-up function $\mathcal{F}_{mK}$ may be derived, as indicated by Equation [5] below:

$$\mathcal{F}_{mK}\{x(n-m)\} = \sum_{k=0}^{K} h_k(m) x(n-m)^k \qquad [5]$$

Accordingly, each look up table (LUT) value $\mathcal{F}_{mK}$ at a given memory depth m may be based on a sum over all corrected distortion orders of the product of order-specific coefficients and the real component value at the memory depth. A pre-distorted signal v(n) may be found by summing the outputs of the M+1 LUTs, as given by Equation [6] below:

$$v(n) = \sum_{m=0}^{M} \mathcal{F}_{mK}\{x(n-m)\} \qquad [6]$$

For a mixed-mode real DPD circuit, such as 210, the linear memoryless term of v(n) may be omitted to generate the pre-distorted nonlinear component u(n), which may be given by [7] below:

$$u(n) = v(n) - h_1(0) x(n) \qquad [7]$$

To remove the linear memoryless term from the LUT bank 250, in some examples, the output of the memoryless LUT 252a may be modified from the general form given by Equation [5] above to the form given by Equation [8] below:

$$\mathcal{F}_{0K}\{x(n)\} = h_0 + \sum_{k=2}^{K} h_k(m) x(n)^k \qquad [8]$$

Accordingly, values from the memoryless LUT 252a may omit first order terms from the indicated sum. Correction for first order terms may be affected, for example, by the linear DPD circuit 202. Additional LUTS 252b, 252i may be configured, for example, as set forth about in Equation [5].

Figure 7A:
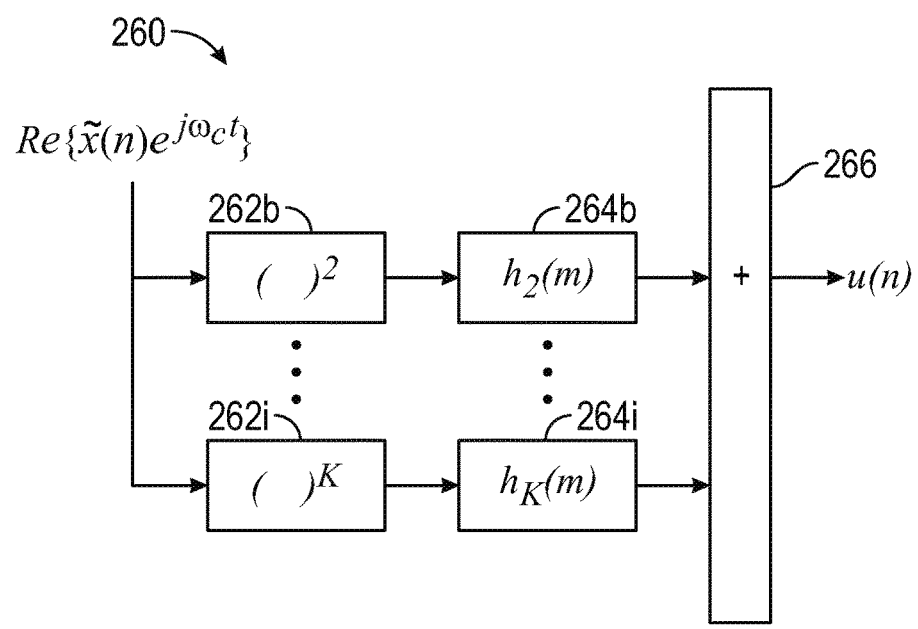
FIGS. 7A and 7B are a diagram showing an example of a Finite Impulse Response (FIR) filter that may be used to implement the real DPD circuit in addition to or instead of the LUT bank of FIG. 6.
Figure 7B:
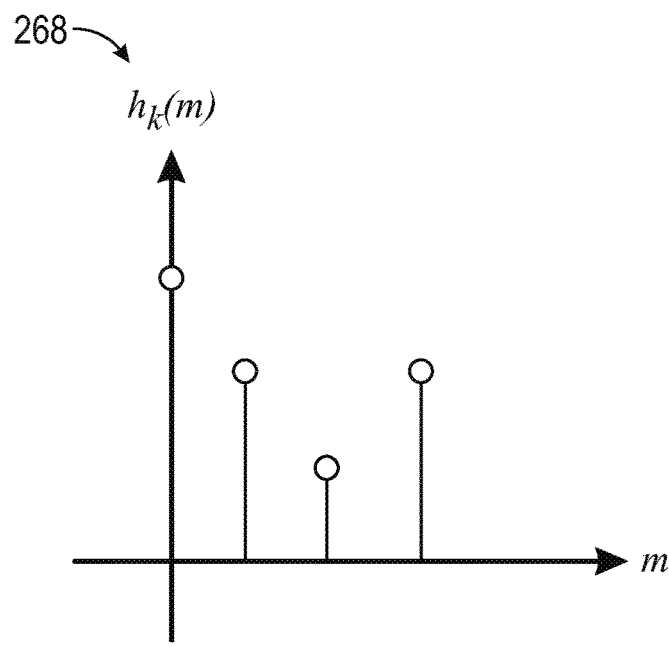

FIGS. 7A and 7B are a diagram showing one example of a Finite Impulse Response (FIR) filter 260 that may be used to implement the real DPD circuit 210 of the nonlinear DPD circuit 204 in addition to or instead of the LUT bank 250. The FIR filter 260 may comprise taps 264b, 264i. The number of taps 264b, 264i may depend on the memory depth M of the real DPD circuit 210. Each tap 264b, 264i may receive an output of a corresponding power circuit 252b, 252i that may raise a current value of the real signal x to a power corresponding to the order of the tap 264b, 264i. As shown, a first order tap (e.g., a tap with coefficient $h_l(m)$) is omitted to generate the pre-distorted nonlinear component u. Example values for the taps 264b, 264i as a function of memory depth m are shown by plot 268. In the example shown in FIGS. 7A and 7B, no first order or linear FIR filter is included in the real DPD circuit 210. In some examples, a linear FIR may be included, but the linear FIR may omit its zero memory tap.

Figure 8A:
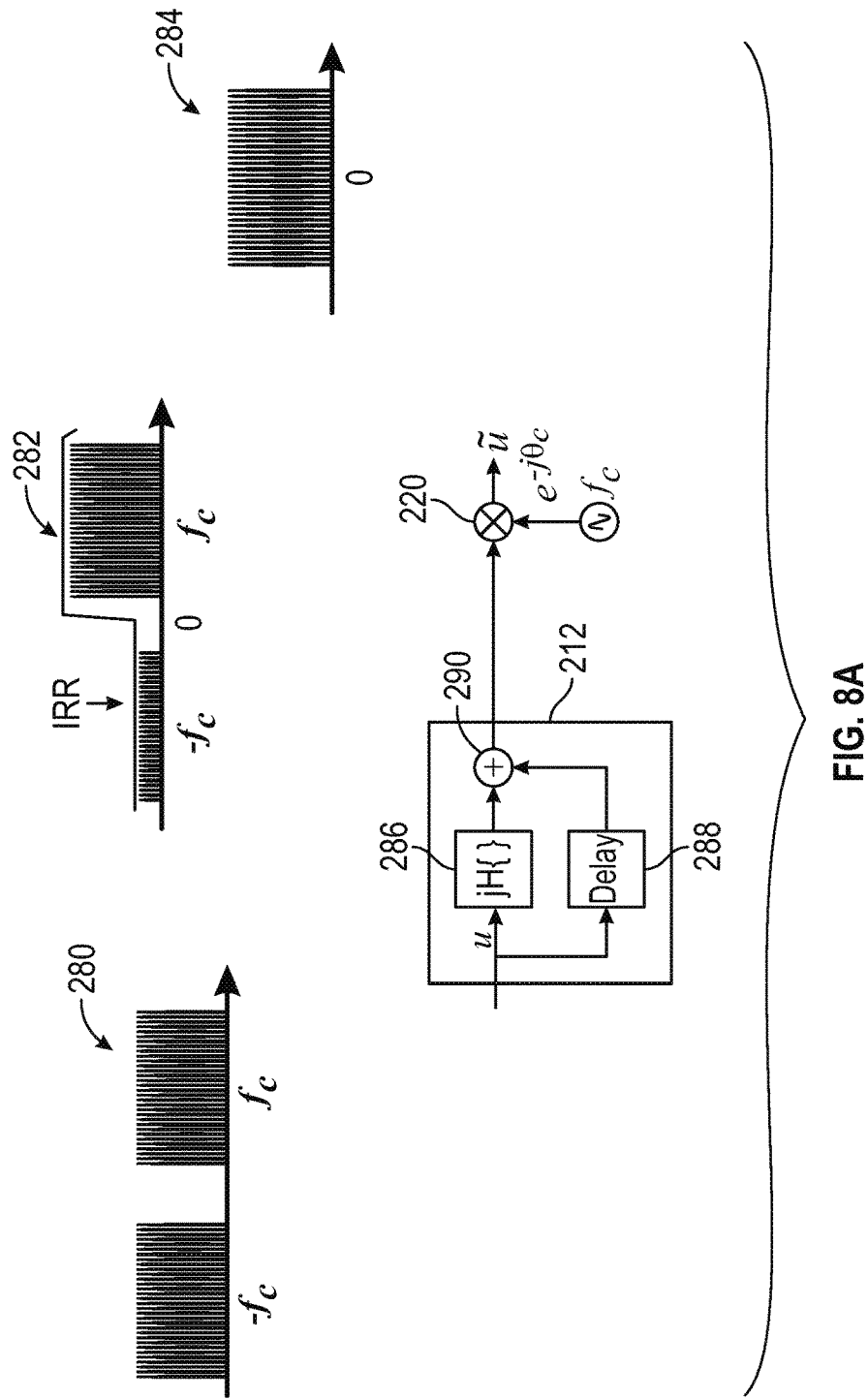
FIGS. 8A, 8B and 8C are a diagram illustrating components of the real-to-complex circuit and mixer.
Figure 8B:
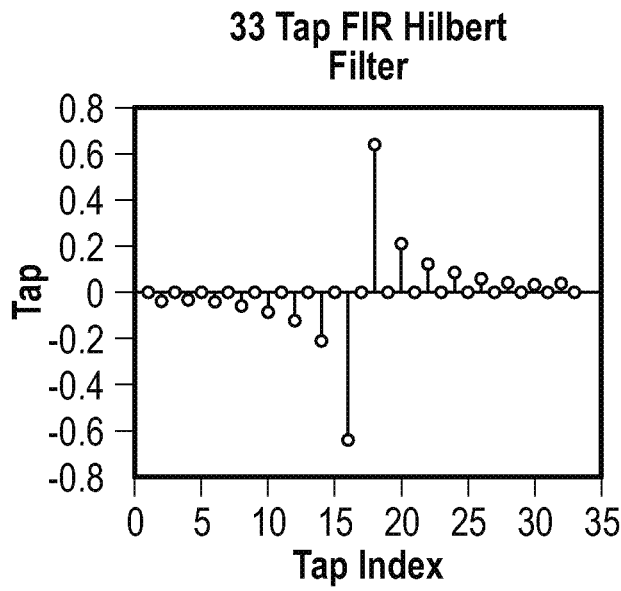
Figure 8C:
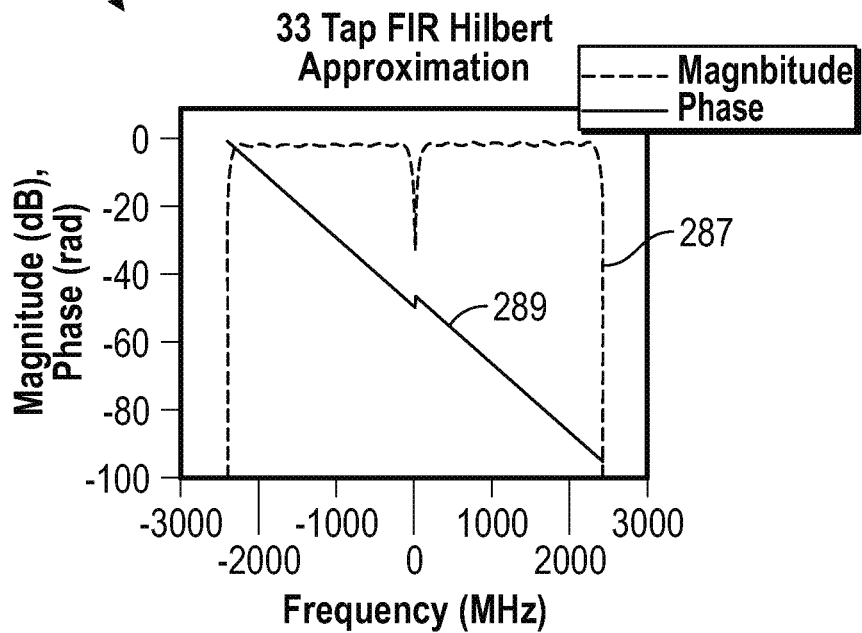

FIGS. 8A, 8B and 8C are a diagram illustrating components of the real-to-complex circuit 212 and mixer 220. The output of the real DPD circuit 210 may be a pre-distorted nonlinear component u that is in real mode and centered at the carrier frequency. This is indicated by plot 280, which shows the pre-distorted nonlinear component u. For example, the plot 280 shows positive and negative frequency content centered on the carrier frequency $f_c$ and at the negative carrier frequency $-f_c$. The example of the real-to-complex circuit 212 shown in FIGS. 8A, 8B and 8C includes a Hilbert transform FIR filter 286 and a delay circuit 288. The real signal u may be the real component of the complex output of the circuit 212. The FIR filter 286 may yield a quadrature component of the complex output of the circuit 212. The real and quadrature components may be summed at a summer 290 to generate the complex output of the circuit 212. Plot 282 shows an example of the complex output of the circuit 212. This output may be translated to baseband, which may yield the pre-distorted nonlinear component u, centered at baseband, indicated by example plot 284.

As shown, the primary frequency content of complex output of the circuit 212 is centered on the carrier frequency $f_c$, with content from the real signal that was at the negative carrier frequency $f_c$ suppressed by an image reduction ratio (IRR). The Hilbert filter 286 may be selected to achieve an IRR that brings the negative frequency content of the complex output of the circuit 212 to an acceptably low level. The IRR achieved by the Hilbert filter 286 may depend on the number of taps of the Hilbert filter 286. Plot 284 shows tap values for a thirty-three (33) tap Hilbert filter 286. Plot 285 shows an example magnitude response 287 and phase response 289 of a 33 tap Hilbert filter centered at baseband, although the output of the filter 286 may be centered at the carrier frequency $f_c$.

Figure 9:
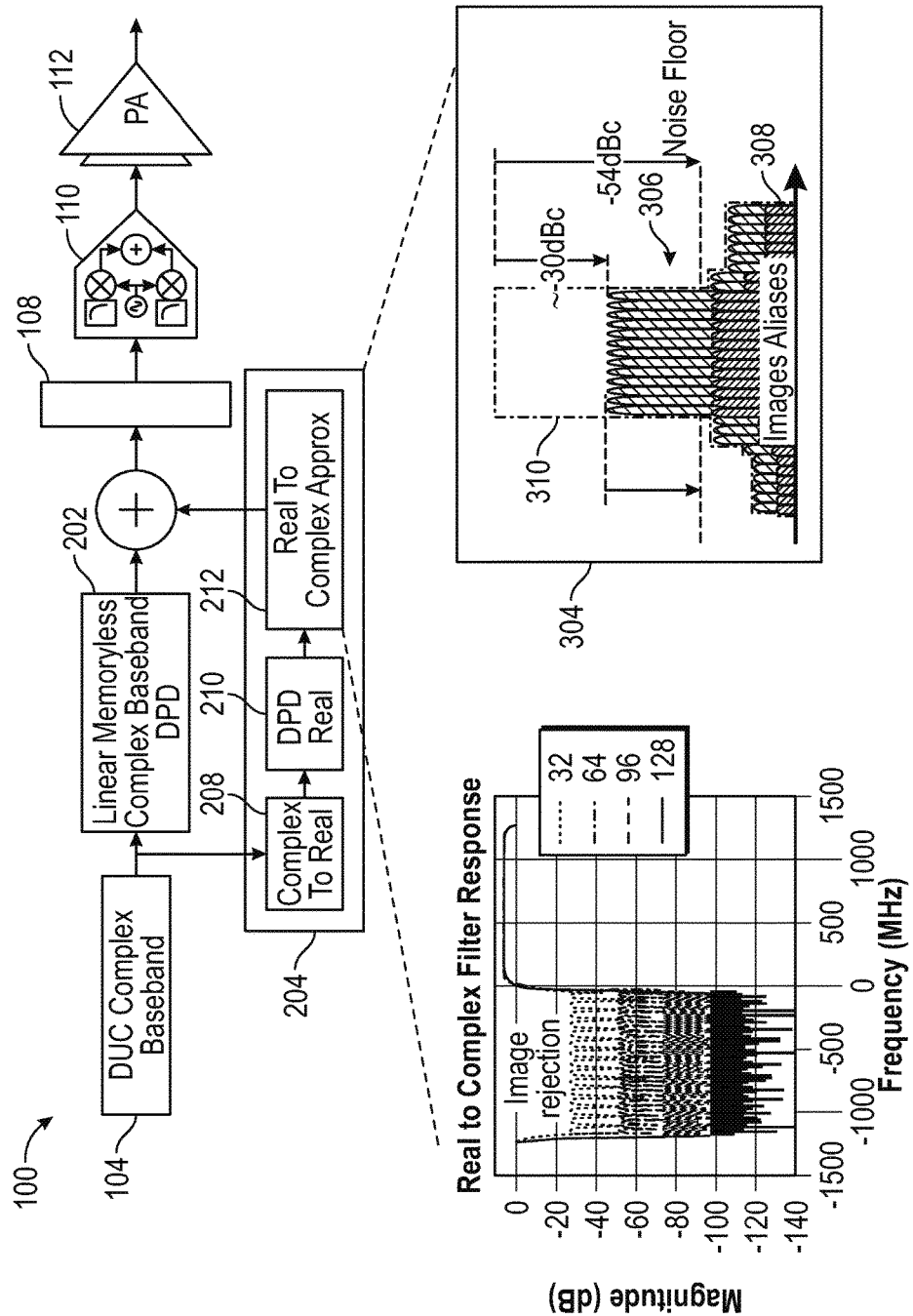
FIG. 9 is a diagram showing an example of the PA circuit of FIG. 1 along with plots showing example Hilbert filter responses and examples of the pre-distorted nonlinear component ũ.

FIG. 9 is a diagram showing an example of the PA circuit 100 along with plots showing example Hilbert filter responses and examples of the pre-distorted nonlinear component ũ. For example, plot 302 shows magnitude responses in the negative frequency range for Hilbert filters with different numbers of taps. For example, a 32 tap Hilbert filter, as shown, may provide an image rejection ratio (IRR) of about 25 dB. A 64 tap filter may provide an IRR of about 55 dB. A 96 tap filter may provide an IRR of about 75 dB. A 128 tap filter may provide an IRR of about 128 dB. Plot 304 shows the pre-distorted nonlinear component ũ. The pre-distorted nonlinear component includes predistortion terms 306 as well as noise 308. Noise 308 may result from images generated by the Hilbert filter of the complex-to-real circuit 212, aliases from up-sampling and/or down-sampling, etc. The plot 304 also shows the pre-distorted signal linear component $ũ_l$ in phantom.

In some examples, the noise floor of the PA circuit 100 may be about 54 dB below the magnitude of the pre-distorted signal ṽ. As shown by the plot 304, this is also about 54 dB below the magnitude of the pre-distorted signal linear component $ũ_l$. Also shown by the plot 304, however, is that the predistortion terms 306 of the pre-distorted nonlinear component ũ are already about 30 dB to the carrier frequency (dBc) below the magnitude of the pre-distorted signal linear component $ũ_l$. Accordingly, the Hilbert filter 286 of the real-to-complex circuit 212 may achieve an effective IRR of −54 dB by adding an additional ~25 dB to the 30 dB reduction already built in to the pre-distorted nonlinear component. This may enable the of a Hilbert filter with fewer taps (e.g., 32 or 33) instead of a larger, more expensive filter. Accordingly, in some examples, splitting the DPD circuit 102 between the linear DPD circuit 202 and the nonlinear DPD circuit 204, including the real DPD circuit 210, may allow the DPD circuit 102 to enjoy the advantages of real-mode processing while minimizing the disadvantages. For example, the mixed-mode DPD circuit 102 may enjoy simplified correction of multiple orders of distortion at multiple harmonic frequency zones in the real DPD circuit 210. Separate processing of the linear term, however, may reduce the complexity of the real-to-complex converter, as described above.

This is further illustrated by FIGS. 10A and 10B, which show a real-mode DPD circuit 320 configured to process linear terms and the real DPD circuit 210 and real-to-complex circuit 212 described herein. Plot 325 shows an example frequency response of the output of the real-mode DPD 322, indicated as the real input or i/p of the real-to-complex circuit 324. The real input includes two negative frequency peaks at 200 MHz and 800 MHz as well as corresponding negative frequency peaks at −200 MHz and −800 MHz. The complex output (e.g., the output of the real-to-complex circuit 324 utilizing a 32 tap Hilbert filter) is also shown. As illustrated, the output comprises negative frequency peaks at −200 MHz and −800 MHz that are reduced by about 40 dB from the corresponding negative frequency peaks of the input. In applications with a noise floor more than about 40 dB below the signal peak, then, the 32 tap Hilbert filter may be insufficient. Plot 328 also shows an example input and output to the real-to-complex circuit 212. As described herein, the input to the real-to-complex circuit 212 omits linear terms. Accordingly, the −200 MHz and −800 MHz frequency peaks of the input are already about 20 dB lower in plot 328 than in plot 325. Accordingly, the 32 tap Hilbert filter provides a total IRR of about 60 dB, which may be acceptable for some applications.

Figure 11:
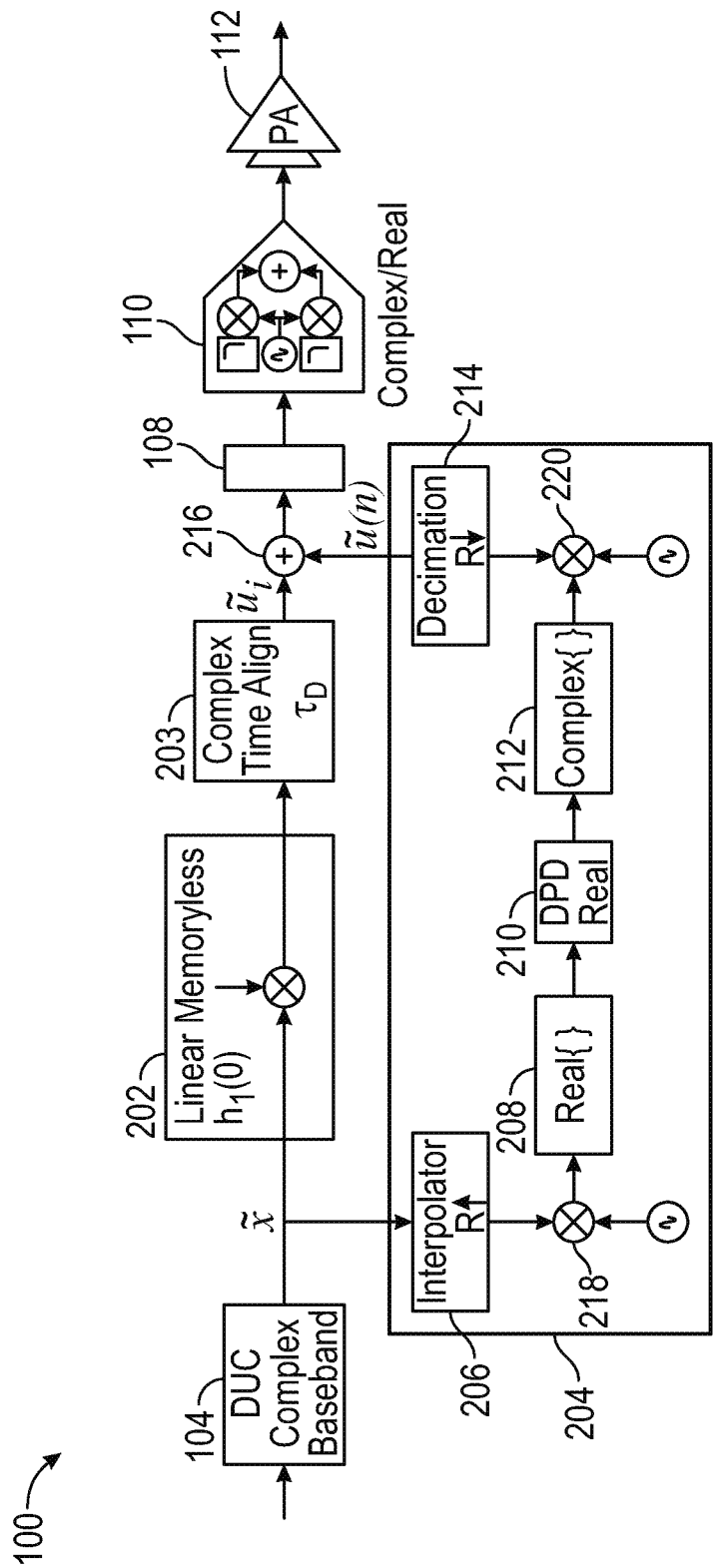
FIG. 11 is a diagram showing an example of the PA circuit of FIG. 1 including additional details of the linear DPD circuit.

FIG. 11 is a diagram showing one example of the PA circuit 100 including additional details of the linear DPD circuit 202. In some examples, the linear DPD circuit 202 may include a single scalar gain stage $h_l(0)$. In some examples, the single scalar gain stage $h_l(0)$ may be equivalent to the linear tap or term omitted from the real DPD circuit 210, as described herein. The value of the scalar gain $h_l(0)$ may be set by the training circuit 106, for example, as described herein. In some examples, a complex time align circuit 203 may be included upstream of the linear DPD circuit 202 prior to the summer 216. The complex time align circuit 203 may be configured to apply a delay $\tau_D$ to the output of the linear DPD circuit 202. The delay $\tau_D$ may be selected to align the time and phase of the pre-distorted signal linear component $ũ_l$ with the pre-distorted nonlinear component ũ. For example, the complex time align circuit 203 may compensate for propagation delays and/or phase changes to the pre-distorted nonlinear component ũ due to additional processing (e.g., from the interpolator circuit 206, the real-to-complex circuit 208, the real DPD circuit 210, the complex-to-real circuit 212, the decimator circuit 214, the mixers 218, 220, etc.).

Figure 12:
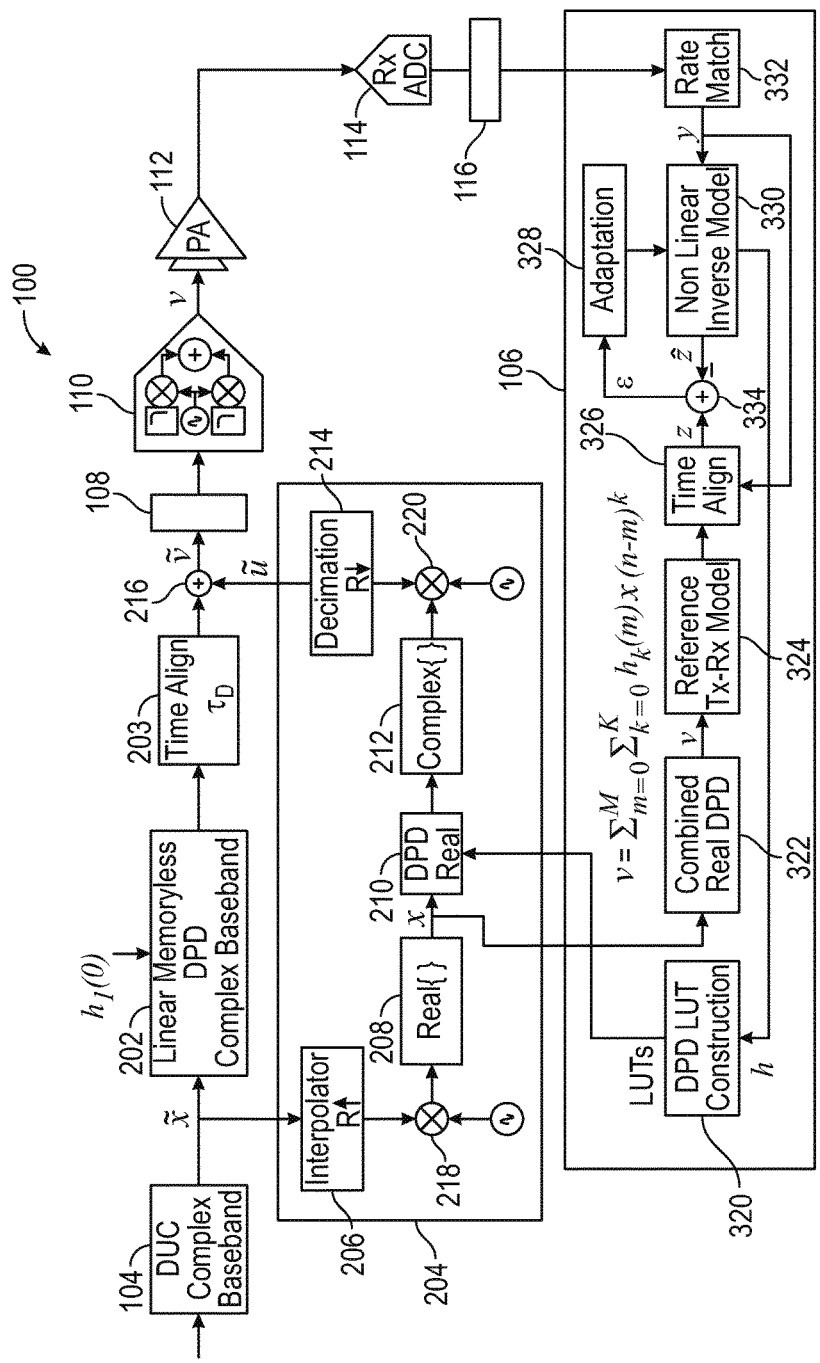
FIG. 12 is a diagram showing an example of the PA circuit of FIG. 1 including additional details of the training circuit.

FIG. 12 is a diagram showing one example of the PA circuit 100 including additional details of the training circuit 106. The example training circuit 106 shown in FIG. 12 operates in real-mode by comparing a real pre-distorted signal v to the feedback signal y. For example, the pre-distorted complex baseband signal ṽ provided to the DAC 110 and PA 112 may be a complex signal at baseband. The pre-distorted nonlinear component u may be real, but may also exclude the linear, memoryless component, which is determined by the linear DPD circuit 202. Accordingly, the training circuit 106 may receive the input signal x at a combined real DPD circuit 322. The combined real DPD circuit 322 may find the combined real pre-distorted signal v. The combined real DPD circuit 322 may implement a complete real DPD. For example, the combined real DPD circuit 322 may utilize a bank of LUTs and/or an FIR filter that includes linear memoryless terms. For example, the real pre-distorted signal v may be determined from the input signal x as described by Equation [4] above. A reference model filter circuit 324 and time alignment circuit 326 may be applied to the real pre-distorted signal v to emulate the PA 112 and align the reference output z with the feedback signal y.

The feedback signal y may be processed by a rate match circuit 332 to increase its sampling frequency to match the sampling frequency of the input signal x and the real pre-distorted signal v. The rate-matched feedback signal may be provided to a nonlinear inverse model circuit 330. The nonlinear inverse model circuit 330 may generate an actual output $\hat{z}$. A difference circuit 334 may find a difference E between the actual output $\hat{z}$ and the reference output z. The difference c may be provided to an adaption circuit that, in conjunction with the nonlinear inverse model circuit 330, may generate a coefficient matrix h. A linear, memoryless term $h_f(0)$ of the matrix h may be provided to the linear DPD circuit 202. The other coefficients of the coefficient matrix h may be provided to the real DPD circuit 210 to be used as FIR filter coefficients and/or to a LUT construction circuit 320, which may utilize the coefficient matrix h to generate LUTs 252a, 252b, 252i, for example, as described above with respect to Equation [8].

The mixed mode DPD circuit 102 described herein may be used for RF transmission and/or higher bandwidth cable implementations. In some examples where the mixed mode DPD circuit 102 is used for cable implementations, a cable uptilt circuit 350 positioned prior to the PA 112 may apply an "uptilt" frequency modification to the pre-distorted signal v. The uptilt frequency modification may compensate for frequency dependent signal loss exhibited by some cables. For example, a cable may exhibit a high frequency rolloff characteristic of about 2 dB of signal amplitude reduction per 100 MHz of frequency, such as at frequencies above 50 MHz. The uptilt frequency modification may amplify higher frequency portions of the signal that are attenuated by the cable so as to reduce frequency-dependent distortions at the signal destination.

Figure 13:
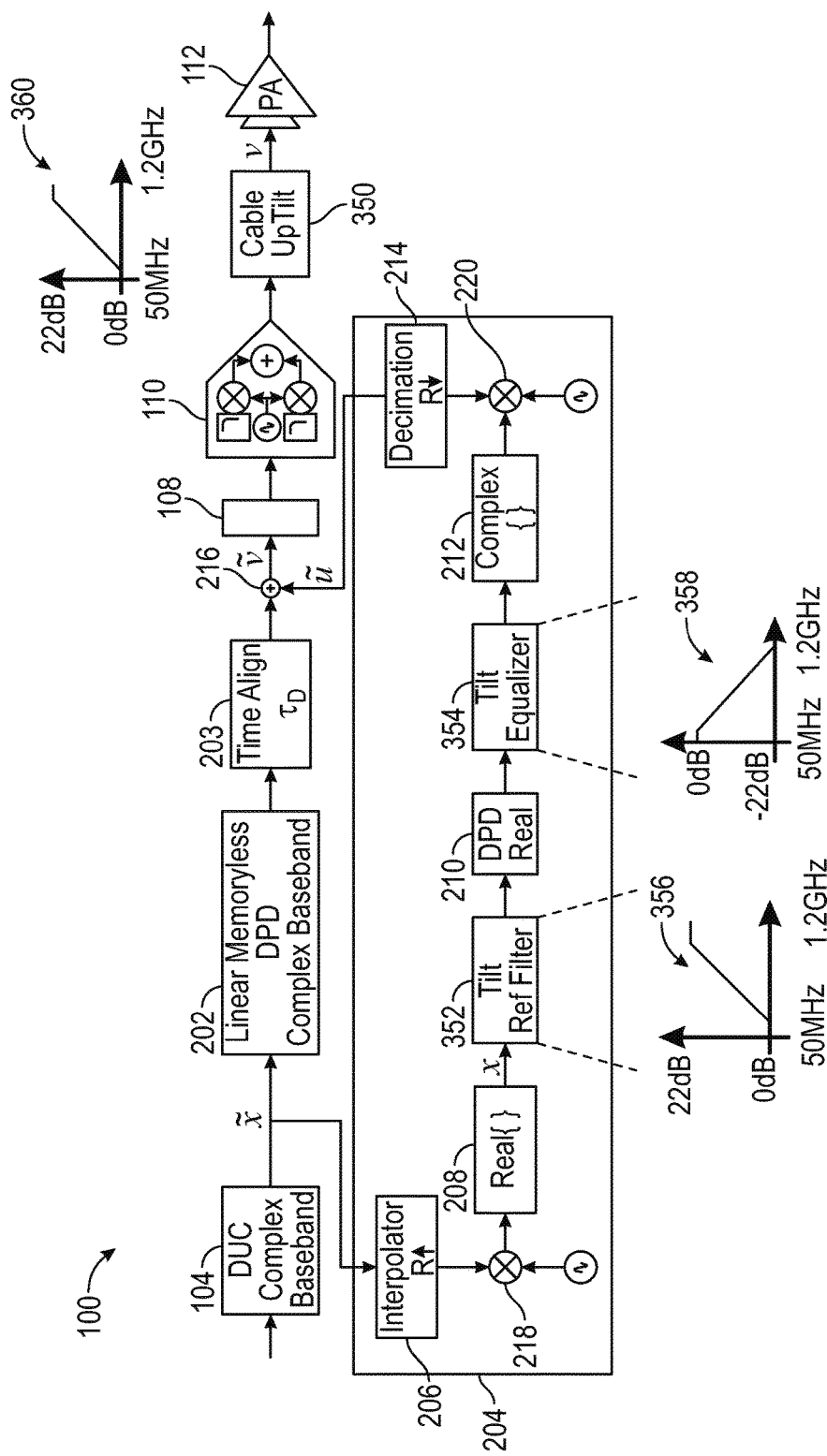
FIG. 13 is a diagram showing one example of the PA circuit of FIG. 1 including a cable uptilt circuit.

FIG. 13 is a diagram showing an example of the PA circuit 100 including a cable uptilt circuit 350. The cable uptilt circuit 350 may be an analog circuit positioned prior to the PA 112 and configured with a highpass frequency gain expansion characteristic, for example to compensate for high frequency rolloff characteristic of a cable or other transmission medium downstream of the PA 112. For example, the cable uptilt circuit 350 may have a highpass frequency gain expansion characteristic of about +2 dB/100 MHz, for example, shown by plot 360.

In the example of FIG. 13, the nonlinear DPD circuit 204 may also include a tilt reference filter circuit 352 positioned prior to the real DPD circuit 210 and a tilt equalizer circuit 354 positioned after the real DPD circuit 210. For example, absent the tilt reference filter circuit 352 and tilt equalizer circuit 354, the DPD circuit 102 may tend to counteract the cable uptilt circuit 350. The tilt reference filter circuit 352 may include a frequency response that can be specified and set to match a desired uptilt observed at the output of the PA circuit 100. Like the analog uptilt circuit 350, the digital uptilt filter circuit 352 can provide a highpass frequency gain expansion characteristic (e.g., +2 dB/100 MHz amplification for frequencies exceeding 50 MHz) of a cable to offset or compensate for the lowpass frequency dependent signal loss of the cable 102. This is illustrated by the plot 356, which shows a +2 dB/100 MHz gain characteristic for frequencies above 50 MHz.

The tilt equalizer circuit 354 may be may include a digital equalizer having a frequency modification setting that has a lowpass filter characteristic, such as shown in plot 258, such as approximately −2.2 dB/100 MHz for frequencies above 50 MHz, which may be approximately the inverse of the frequency modification provided by the digital tilt reference filter circuit 352 and analog uptilt circuit 350. The particular frequency modification to be provided by the equalizer circuit 354 can be selected to compensate for or eliminate the effect of the analog uptilt circuit 350 interposing a frequency dependent uptilt gain and group delay variation between the real DPD circuit 210 and the PA 112. The particular frequency modification provided by the tilt equalizer circuit 354 may be selected to provide a substantially constant gain versus frequency, a substantially constant group delay versus frequency or both, such as at the output of the tilt equalizer circuit 354. In some examples, the tilt equalizer circuit may also be configured to correct for other frequency dependent artifacts resulting, for example, from low pass filtering, decimation, and Hilbert transform. The tilt reference filter circuit 352 and tilt equalizer circuit 354 may be run in real mode at the up-sampled sampling frequency of the nonlinear DPD circuit 204. In some examples, a mixed mode DPD circuit 102 having separate linear and nonlinear DPD circuits 202, 204 as described herein, may omit the tilt equalizer circuit 354. For example, the output of the real DPD circuit 210 may be provided to the real-to-complex circuit 212, mixer 220 and/or decimator circuit 214.

Figure 14:
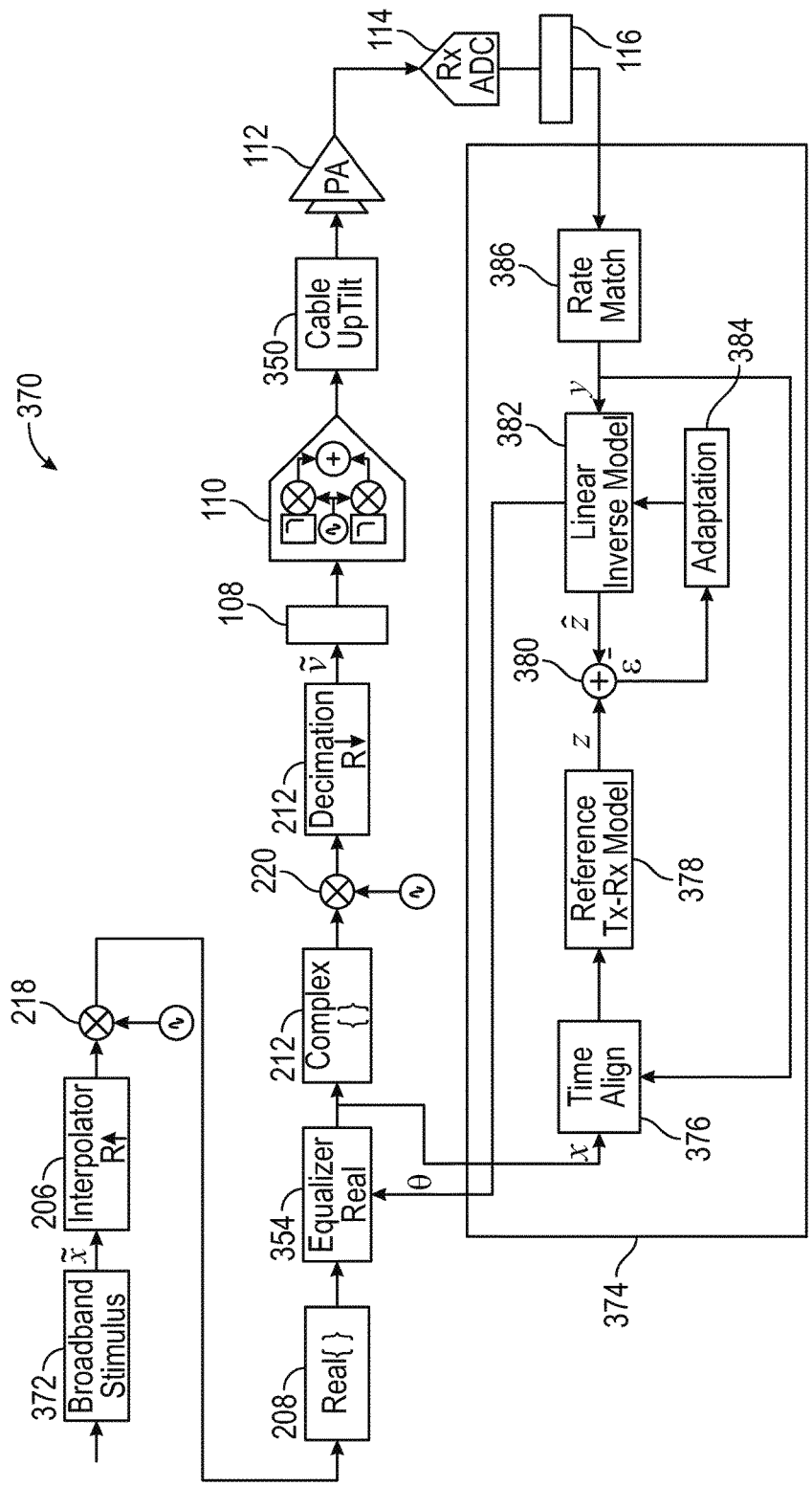
FIG. 14 is a diagram showing an example of a configuration setup of a PA circuit for training the tilt equalizer.

FIG. 14 is a diagram showing one example of a configuration setup 370 of a PA circuit for training the tilt equalizer 354. A broadband stimulus circuit 372 may generate a broadband stimulus signal indicated in FIG. 14 by $\tilde{x}$. The broadband stimulus signal may be provided to the interpolator circuit 206, mixer 218, and complex-to-real converter circuit 208, for example, as described herein, to generate a real signal x. The tilt equalizer 354 may receive the real signal x. An output of the tilt equalizer 354 may be provided to the real-to-complex converter 212, the mixer 220, and the decimator circuit 212, as described herein, to generate an output signal. The output signal may be provided to the DAC 110, analog cable uptilt filter 350 and PA 112.

An uptilt training circuit 374 may generate a tap coefficient vector θ of tap coefficients $\theta_i$ for the uptilt equalizer circuit 354. For example, an output of the uptilt equalizer circuit 354, indicated in FIG. 14 by x, may be used to generate a reference output z. A time alignment circuit 376 and reference model circuit 378 may act on the uptilt equalizer output x to generate the reference output z. Similarly, the feedback signal y may be rate matched to the up-sampled sampling frequency of the interpolator circuit 206 by rate match circuit 332. Linear inverse model circuit 382 may receive the feedback signal y and generate an actual output $\hat{z}$. A difference circuit 380 may receive the reference output z and actual output $\hat{z}$ and, in conjunction with the linear inverse model circuit 382, generate the tap coefficient vector θ.

Figure 15A:
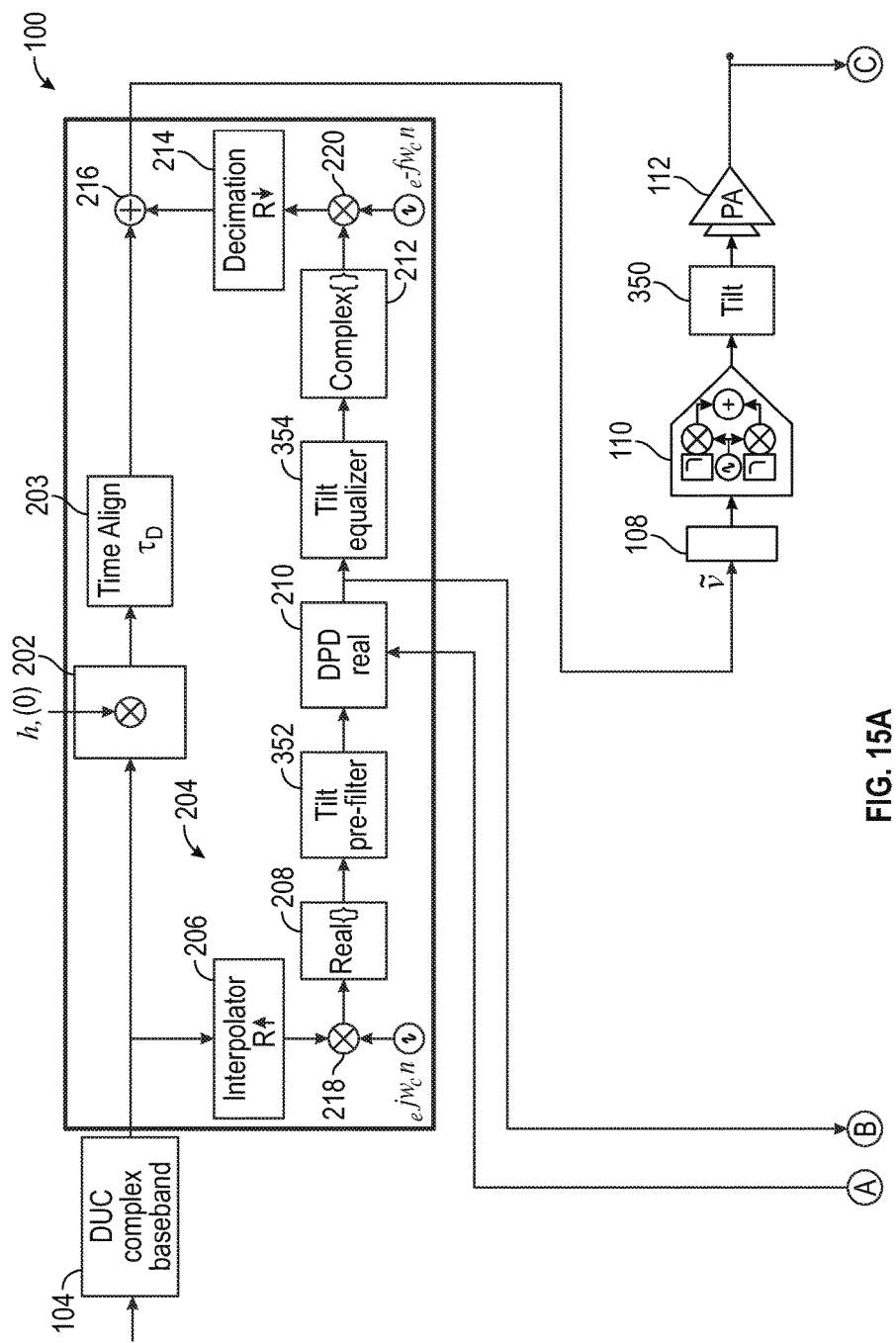
FIGS. 15A and 15B is a diagram showing one example of the PA circuit of FIG. 1 including a cable uptilt circuit and another example of a training circuit.
Figure 15B:
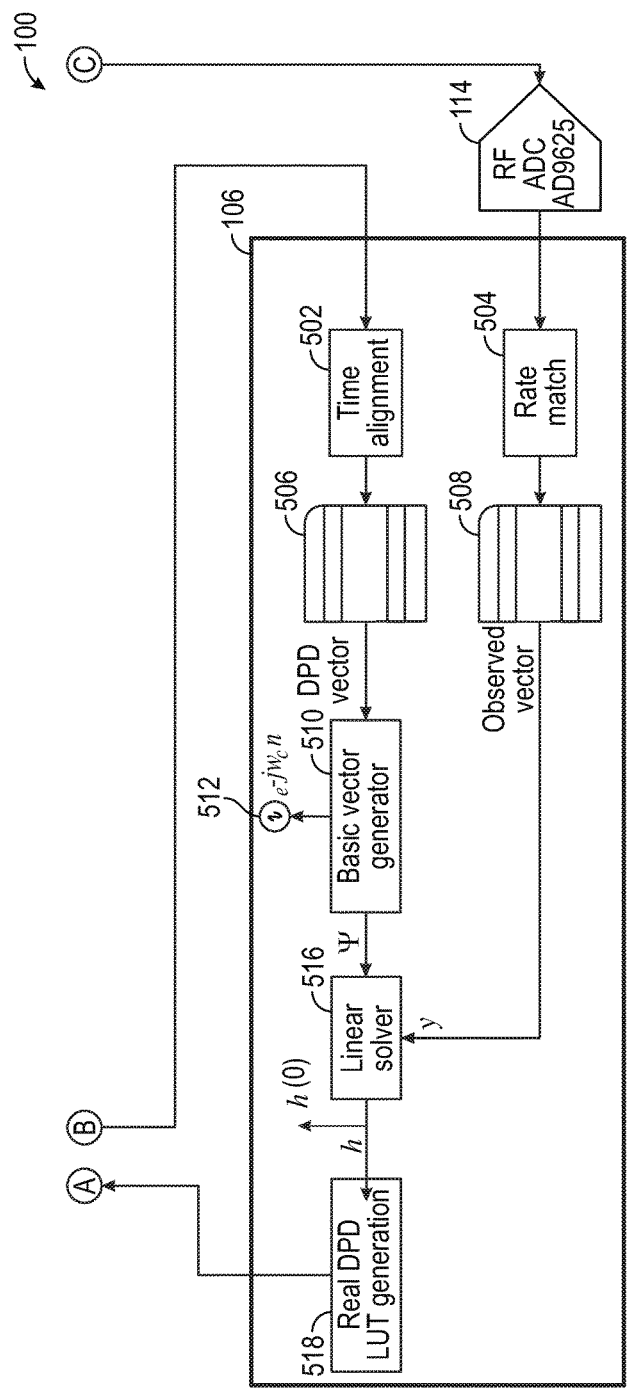

FIGS. 15A and 15B are a diagram showing one example of the PA circuit 100 of FIG. 1 including a cable uptilt circuit 350 and another example of a training circuit 106. The training circuit 106' is another example of a training circuit that may be used, in some examples, in place of the training circuit 106 shown in FIG. 12. The nonlinear DPD circuit 204 shown in FIGS. 15A and 15B may be similar to the nonlinear DPD circuit 204 as configured in FIG. 13 with the tilt reference filter 352 and tilt equalizer 354 positioned and the cable uptilt circuit 350 as shown.

The configuration of the training circuit 106 shown in FIGS. 15A and 15B receives an output of the power amplifier 112, for example, via ADC 114. In some examples, a communication link, such as 116 in FIG. 12, may also be included. The training circuit 106 may also receives an output of the real DPD circuit 210. A time alignment circuit 502 and rate match circuit 504 may match the timing and the sampling frequencies of the output of the real DPD circuit 210 and the output of the power amplifier 112. For example, propagation delays from the components of the nonlinear DPD circuit, the power amplifier 112 and other various components may cause the output of the power amplifier 112 to be delayed relative to the output of the real DPD circuit 210. Also, as described herein, the sampling frequency after the interpolator 206 and before the decimator 214 (e.g., where the output of the real DPD circuit 210 is taken) may be higher than the sampling frequency at the ADC 114. For example, the sampling frequency at the ADC may match the sampling frequency of the complex baseband signal.

Values for the output of the real DPD circuit 210 and the power amplifier 112 may be stored at respective memory buffers 506, 508. For example, memory buffer 506, which receives the output of the real DPD circuit 210, may provide to a basis vector generation circuit 510 a DPD vector constructed from values of the output of the real DPD circuit 210 stored at the memory buffer 506 over time. The basis vector generation circuit 510 may shift the DPD vector by the carrier frequency 512 to generate a basis vector matrix, represented in FIGS. 15A and 15B by $\Psi$. A linear solver circuit 516 may receive the basis vector matrix $\Psi$ and a corresponding observed vector y matrix generated from the memory buffer 508. The linear solver circuit 516 may generate and/or solve a system of linear equations equivalent to $\Psi*h=y$, where h is the coefficient matrix for the DPD circuit 100. A linear, memoryless term $h_l(0)$ of the coefficient matrix A may be provided to the linear DPD circuit 202. The other coefficients of the coefficient matrix h may be provided to the real DPD circuit 210 to be used as FIR filter coefficients and/or to a LUT construction circuit 518, which may utilize the coefficient matrix h to generate LUTs 252a, 252b, 252i, for example, as described above with respect to Equation [8].

Figure 16:
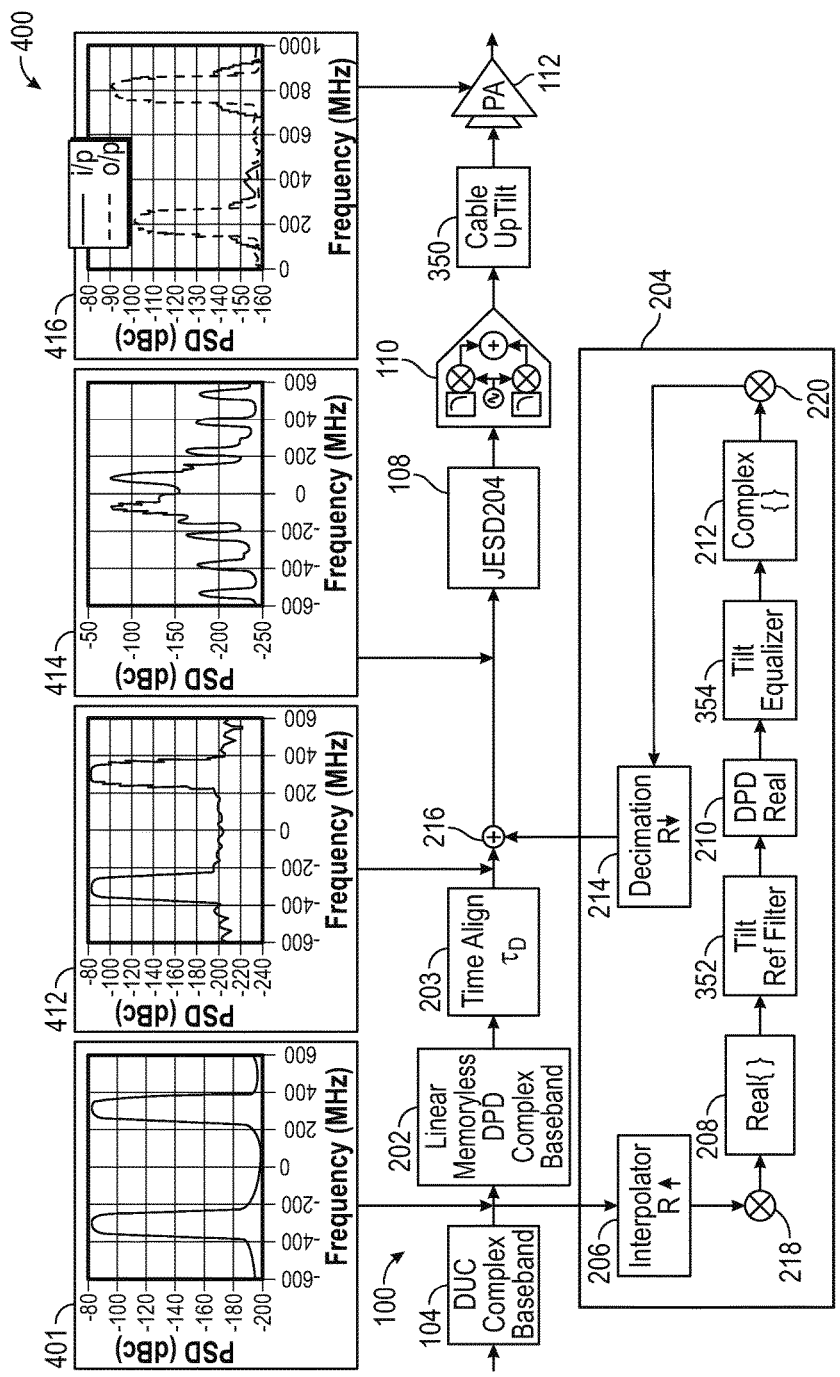
FIGS. 16 and 17 are a diagram showing the PA circuit of FIG. 1 in the example configuration of FIG. 13 including modeled power spectral densities at various positions in the circuit.

In the example of FIG. 16, the training circuit the basis vector matrix $\Psi$ is generated from an output of the real DPD circuit 210. In some examples, the example configuration shown in FIGS. 15A and 15B could also be configured to generate the basis vector matrix $\Psi$ from an input of the real DPD circuit 210, for example, similar to the example of FIG. 12.

In the examples of FIGS. 13 and 15, the tilt reference filter 352 and tilt equalizer 354 are implemented in the nonlinear DPD circuit 204, for example, at the higher sampling frequency $f_s$, and therefore higher clocking frequency, that is implemented after the interpolator circuit 206 and before the decimator circuit 214. In some examples, however, the tilt reference filter 352 and/or tilt equalizer 354 may be positioned at any suitable position in the nonlinear DPD circuit 204. For example, the tilt reference filter 352 may be positioned prior to the interpolator circuit 206 and/or the tilt equalizer circuit 354 may be positioned after the decimator circuit 214. This may allow the circuits 352, 354 to operate in complex mode and, therefore, at a lower sampling frequency and clock rate.

Figure 17:
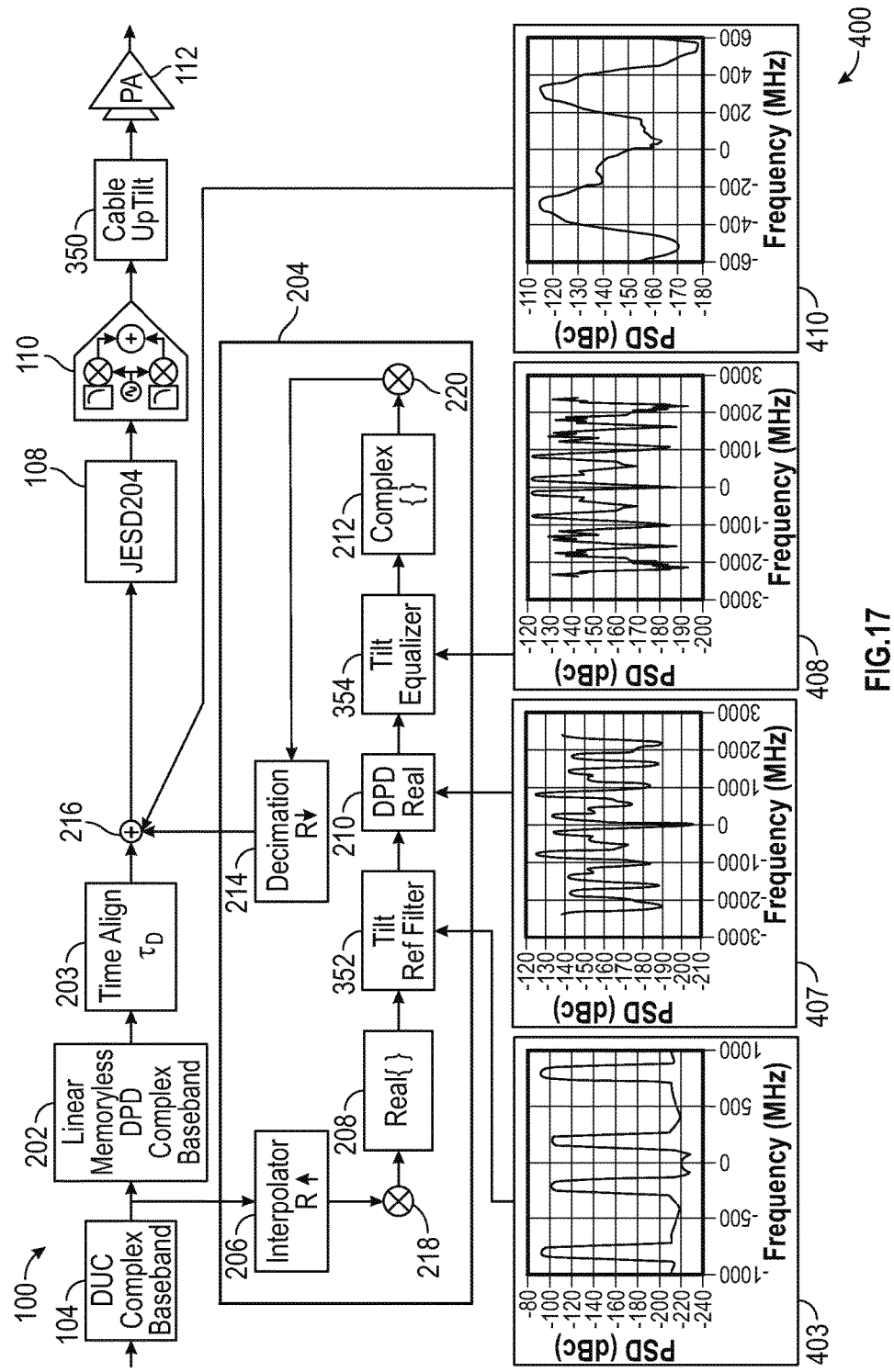

FIGS. 16-17 are a diagram showing the PA circuit 100 in the example configuration of FIG. 13 including modeled power spectral densities at various positions in the circuit 100. A plot 401 shows the power spectral density of the example complex baseband signal x̃. The example complex baseband signal x̃ comprises two frequency components, one centered at about 300 MHz and another centered at about −300 MHz. A plot 403 shows an input to the real DPD circuit 210. The input shown at plot 403 may be an up-sampled real-mode signal with frequency content centered at 200 MHz, 800 MHz, −200 MHz, and −800 MHz. The input shown at the plot 403 may have been processed by the interpolator circuit 206 the mixer 218, the complex-to-real circuit 208, and the tilt reference filter 352. For example, the bandwidth of the input signal shown in plot 403 is between about −900 MHz and 900 MHz, or about 1.8 GHz, which is more than double the bandwidth of the complex baseband signal x̃. Also, the input signal shown in plot 403 is a real signal, with instances of the frequency components of the complex baseband signal x̃ both in the real and complex frequency domains. The input of the plot 403 also demonstrates tilt filtering. For example, the peaks of the frequency components in the positive frequency domain are tilted up to the right.

A plot 407 shows an example pre-distorted nonlinear component u prior to tilt equalizing and complex conversion. A plot 408 shows an example of the pre-distorted nonlinear component u after tilt equalizing. A plot 410 shows the complex pre-distorted nonlinear component ũ. A plot 412 shows the pre-distorted signal linear component ũ$_l$. Plot 414 shows the pre-distorted complex baseband signal ṽ. Plot 416 shows the pre-distorted transmission signal v after the analog uptilt circuit 350.

Figure 18:
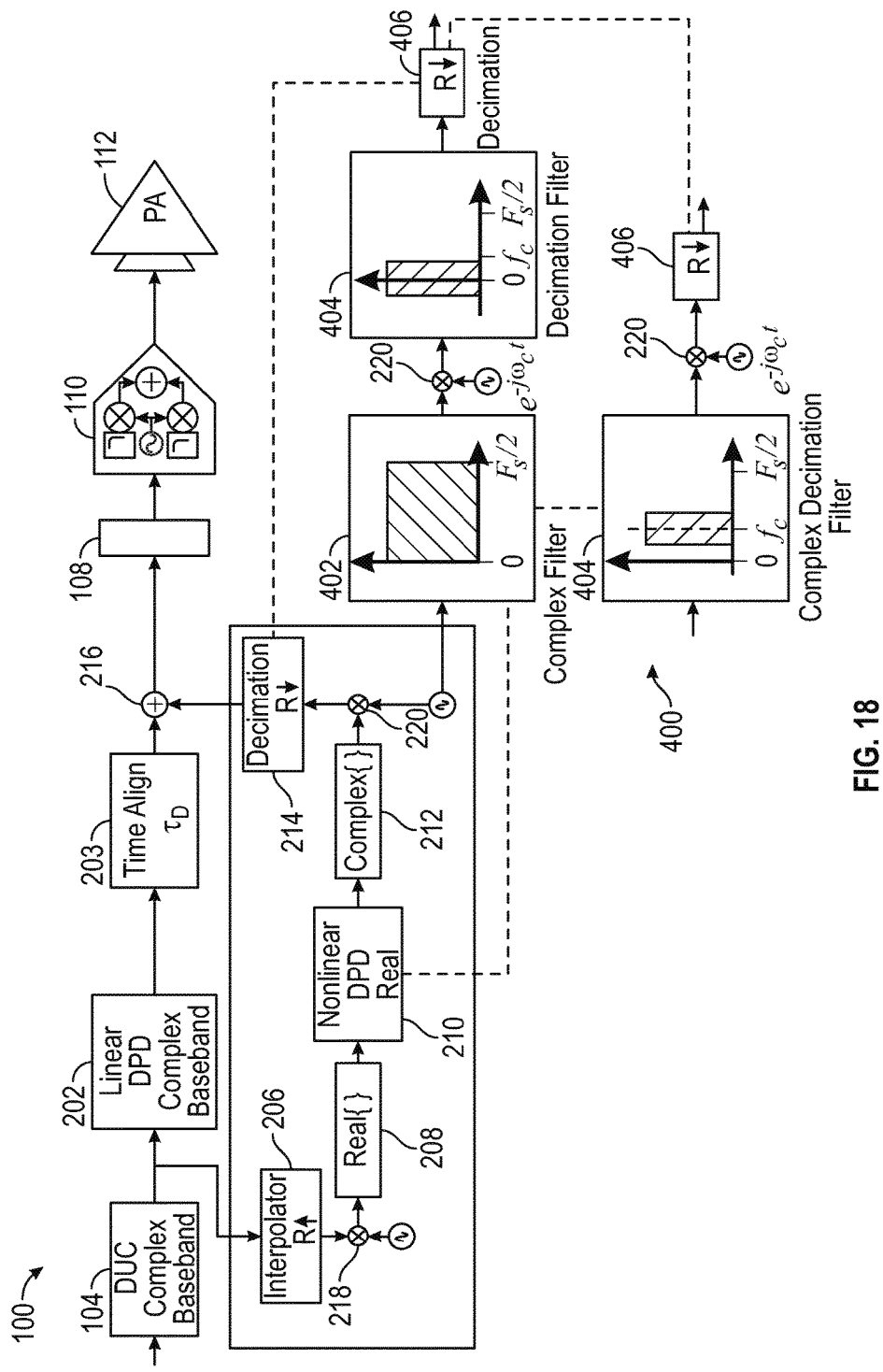
FIG. 18 is a diagram showing an example of the PA circuit of FIG. 1 configured to consolidate the complex or Hilbert filter and the decimation filter.

FIG. 18 is a diagram showing one example of the PA circuit 100 configured to consolidate the complex or Hilbert filter and the decimation filter. For example, as described herein with respect to FIGS. 8-10, the real-to-complex converter circuit 212 includes a Hilbert or similar FIR filter 286 for determining the quadrature component of the complex pre-distorted nonlinear component ũ. FIG. 18 shows a passband 402 of the complex or Hilbert filter 286 of the real-to-complex converter circuit 212. As illustrated, the passband 402 is between zero and the half the sampling frequency Fs. Similarly, decimator circuit 214 may comprise a low-pass decimation filter for anti-aliasing filter. Also shown is a passband 404 of an example decimation filter. The passband 404 is centered at zero or direct current and may have a bandwidth about equal to the bandwidth of the complex baseband signal x̃. The decimator circuit 214 may include the decimation filter shown by passband 404 and a decimator 406.

FIG. 18 also shows an alternate configuration 400 of the real-to-complex circuit 212 and decimation circuit 214. For example, in the alternate configuration 400, the real-to-complex filter comprises a Hilbert or complex decimation filter with a passband 409. The passband 409 may be a combination of the passband 402 and the passband 404. For example, the passband 409 may have a bandwidth about equal to the bandwidth of the complex baseband signal x̃. Because the complex decimation filter is positioned prior to the mixer 220, its passband may be centered at the carrier frequency $f_c$. After application of the complex decimation filter, the decimator 406 may be applied. For example, in the configuration 400, the decimation circuit 214 may include the decimator 406 but may omit a decimation filter.

Figure 19:
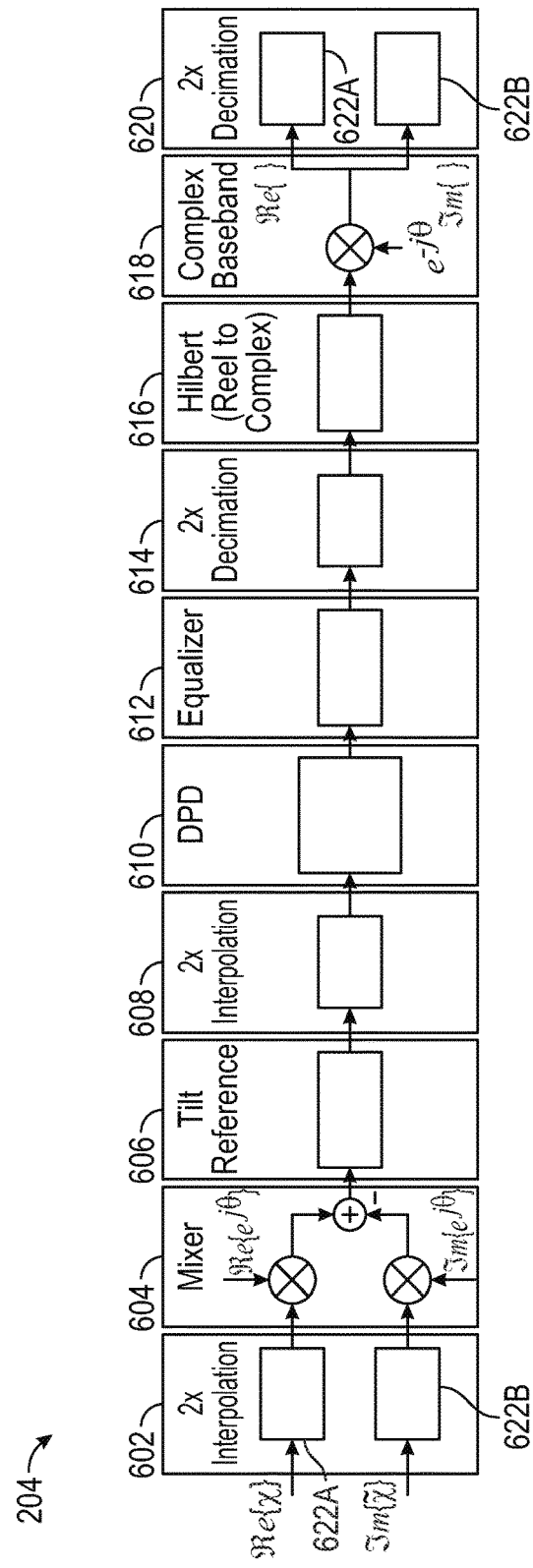
FIG. 19 is a diagram showing an example implementation of the nonlinear DPD circuit including an alternate component configuration.

FIG. 19 is a diagram showing an example implementation of the nonlinear DPD circuit 204 including an alternate component configuration. In the example of FIG. 19, a four times (4×) multirate factor is used. Interpolation is performed in two stages, a first stage interpolator circuit 602 and a second stage interpolator circuit 608. The first stage interpolator circuit 602 includes two one-half (½) band finite impulse response (FIR) filters 622A, 622B. For example, the FIR 622A may receive the real portion of the complex baseband signal x̃ while the FIR 622B may receive the imaginary or quadrature portion of the complex baseband signal x̃. The second stage interpolator circuit 608 may comprise a single FIR. For example, the second stage interpolator circuit 608 may be positioned after the complex baseband signal is converted to a real signal. Each interpolator stage circuit 602, 608 may increase the sampling frequency or bandwidth of the incoming signal by a factor of two (2×), resulting in a total bandwidth increase to four times (4×) the bandwidth of the complex baseband signal x̃.

Interposed between the first and second stage interpolator circuits 608 are a mixer circuit 604 and an optional tilt reference circuit 606. The mixer circuit 604 may multiply the respective outputs of the FIRs 622A, 622B by the carrier frequency and sum the results. The output of the mixer circuit 604 may be a real equivalent of the complex baseband signal, shifted by the carrier frequency. The optional tilt reference filter circuit 606 and optional tilt equalizer circuit 612 may operate, for example, as described herein with respect to the circuits 352, 354 described herein. The real DPD circuit 610 may function in a manner similar to the real DPD circuit 210 described herein.

In the example of FIG. 19, decimation, like interpolation, may be performed by a first stage decimation circuit 614 and a second stage decimation circuit 620. The first stage decimation circuit 614 may operate on the real output of the real DPD circuit 610 (and optional tilt equalizer circuit 612) and may, therefore, utilize a single FIR. First stage decimation circuit may operate to reduce the bandwidth of the output of the real DPD circuit by a factor of two, or down to two times (2×) the bandwidth of the complex baseband signal x̃. Interposed between the decimation circuits 614, 620 is a Hilbert filter circuit 616 to convert the signal to complex mode and a complex baseband circuit to shift the signal back to baseband. Accordingly, the second stage decimation circuit 620 may comprise first and second FIRs 624A, 624B for the respective real (624A) and complex or quadrature (624B) components of the output signal.

VARIOUS NOTES & EXAMPLES

Example 1 is a system comprising: a linear digital pre-distortion (DPD) circuit programmed to generate a pre-distorted signal linear component based at least in part on a complex baseband signal; a nonlinear DPD circuit programmed to generate a pre-distorted signal nonlinear component based at least in part on the complex baseband signal; and a mixer circuit programmed to generate a pre-distorted signal based at least in part on the pre-distorted signal linear component and the pre-distorted signal nonlinear component.

In Example 2, the subject matter of Example 1 optionally includes a complex-to-real circuit programmed to determine a real component based at least in part on the complex baseband signal.

In Example 3, the subject matter of any one or more of Examples 1-2 optionally include an interpolator circuit to up-sample the complex baseband signal to generate an up-sampled complex baseband signal; and an up-converter circuit to translate the up-sampled complex baseband signal to a carrier frequency to generate an up-converted complex signal, wherein the mixer circuit is also to generate the pre-distorted signal based at least in part on the up-converted complex signal.

In Example 4, the subject matter of any one or more of Examples 1-3 optionally include wherein the nonlinear DPD circuit is also programmed to: determine a real component based at least in part on the complex baseband signal; determine a first value for the real component at a first time; and select from a first nonlinear look up table (LUT) a first LUT value based at least in part on the first value for the real component, wherein the first LUT value is a based at least in part on a sum of terms omitting a first order term.

In Example 5, the subject matter of Example 4 optionally includes wherein the nonlinear DPD circuit is also programmed to: select from a second LUT a second LUT value based at least in part on a second value for the real component at a second time before the first time; and determine a sum of the first LUT value and the second LUT value, wherein the pre-distorted signal nonlinear component is based at least in part on the sum.

In Example 6, the subject matter of any one or more of Examples 1-5 optionally include wherein the nonlinear DPD circuit is also programmed to: determine a real component based at least in part on the complex baseband signal; determine a first value for the real component at a first time; determine an Ith order power of the first value; apply an Ith order tap coefficient to the Ith order power of the first value to generate an Ith order tap value; determine a Jth order power of the first value; and apply a Jth order tap coefficient to the Jth order power of the first value to generate a Jth order tap value, wherein the pre-distorted signal nonlinear component is based at least in part a sum of the Ith order tap value and the Jth order tap value.

In Example 7, the subject matter of any one or more of Examples 1-6 optionally include wherein the nonlinear DPD circuit is further programmed to: determine a real-mode pre-distorted nonlinear component; and convert the real-mode pre-distorted nonlinear component to a complex pre-distorted nonlinear component.

In Example 8, the subject matter of Example 7 optionally includes wherein the nonlinear DPD circuit is further programmed to translate the complex pre-distorted nonlinear component to baseband.

In Example 9, the subject matter of any one or more of Examples 1-8 optionally include wherein the linear DPD circuit is further programmed to apply a scalar gain stage to the complex baseband signal.

In Example 10, the subject matter of any one or more of Examples 1-9 optionally include a complex time align circuit programmed to align the pre-distorted linear component and the pre-distorted nonlinear component.

In Example 11, the subject matter of any one or more of Examples 1-10 optionally include a tilt reference filter circuit to apply a highpass frequency gain characteristic to a real component of the complex baseband signal to generate a tilt reference real component, wherein the nonlinear DPD circuit is also programmed to determine a tilt reference real pre-distorted signal nonlinear component based at least in part on the tilt reference real component.

In Example 12, the subject matter of any one or more of Examples 1-11 optionally include wherein the nonlinear DPD circuit is further programmed to generate a real pre-distorted signal nonlinear component at a carrier frequency, further comprising: a complex decimation filter circuit programmed to apply a passband to the real pre-distorted signal nonlinear component to generate a quadrature pre-distorted signal nonlinear component, wherein the passband has a bandwidth matching a bandwidth of the complex baseband signal centered at the carrier frequency; and a demodulation circuit programmed to demodulate the quadrature pre-distorted signal nonlinear component to baseband.

Example 13 is a method comprising: receiving a complex baseband signal; generating a pre-distorted signal linear component based at least in part on the complex baseband signal; generating a pre-distorted signal nonlinear component based at least in part on the complex baseband signal; and generating a pre-distorted signal based at least in part on the pre-distorted signal linear component and the pre-distorted signal nonlinear component.

In Example 14, the subject matter of Example 13 optionally includes determining a real component based at least in part on the complex baseband signal.

In Example 15, the subject matter of any one or more of Examples 13-14 optionally include up-sampling the complex baseband signal to generate an up-sampled complex baseband signal; and translating the up-sampled complex baseband signal to a carrier frequency to generate an up-converted complex signal, wherein generating the pre-distorted signal is also based at least in part on the up-converted complex signal.

In Example 16, the subject matter of any one or more of Examples 13-15 optionally include determining a real component based at least in part on the complex baseband signal; determining a first value for the real component at a first time; and selecting from a first nonlinear look up table (LUT) a first LUT value based at least in part on the first value for the real component, wherein the first LUT value is a based at least in part on a sum of terms omitting a first order term.

In Example 17, the subject matter of Example 16 optionally includes selecting from a second LUT a second LUT value based at least in part on a second value for the real component at a second time before the first time; and determining a sum of the first LUT value and the second LUT value, wherein the pre-distorted signal nonlinear component is based at least in part on the sum.

In Example 18, the subject matter of any one or more of Examples 13-17 optionally include determining a real component based at least in part on the complex baseband signal; determining a first value for the real component at a first time; determining an Ith order power of the first value; applying an Ith order tap coefficient to the Ith order power of the first value to generate an Ith order tap value; determining a Jth order power of the first value; and applying a Jth order tap coefficient to the Jth order power of the first value to generate a Jth order tap value, wherein the pre-distorted signal nonlinear component is based at least in part a sum of the Ith order tap value and the Jth order tap value.

In Example 19, the subject matter of any one or more of Examples 13-18 optionally include determining a real-mode pre-distorted nonlinear component; and converting the real-mode pre-distorted nonlinear component to a complex pre-distorted nonlinear component.

In Example 20, the subject matter of any one or more of Examples 13-19 optionally include applying a scalar gain stage to the complex baseband signal.

In Example 21, the subject matter of any one or more of Examples 13-20 optionally include a complex time align circuit programmed to align the pre-distorted linear component and the pre-distorted nonlinear component.

In Example 22, the subject matter of any one or more of Examples 13-21 optionally include applying a highpass frequency gain characteristic to a real component of the complex baseband signal to generate a tilt reference real component; determining a tilt reference real pre-distorted signal nonlinear component based at least in part on the tilt reference real component; and applying a tilt equalizer to the tilt reference real pre-distorted signal to generate the real pre-distorted signal nonlinear component.

In Example 23, the subject matter of any one or more of Examples 13-22 optionally include generating a real pre-distorted signal nonlinear component at a carrier frequency; applying a passband to the real pre-distorted signal nonlinear component to generate a quadrature pre-distorted signal nonlinear component, wherein the passband has a bandwidth matching a bandwidth of the complex baseband signal centered at the carrier frequency; and demodulating the quadrature pre-distorted signal nonlinear component to baseband.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

The term "circuit" can include a dedicated hardware circuit, a general-purpose microprocessor, digital signal processor, or other processor circuit, and may be structurally configured from a general purpose circuit to a specialized circuit such as using firmware or software.

Any one or more of the techniques (e.g., methodologies) discussed herein may be performed on a machine. In various embodiments, the machine may operate as a standalone device or may be connected (e.g., networked) to other machines. In a networked deployment, the machine may operate in the capacity of a server machine, a client machine, or both in server-client network environments. In an example, the machine may act as a peer machine in peer-to-peer (P2P) (or other distributed) network environment. The machine may be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic or a number of components, or mechanisms. Circuit sets are a collection of circuits implemented in tangible entities that include hardware (e.g., simple circuits, gates, logic, etc.). Circuit set membership may be flexible over time and underlying hardware variability. Circuit sets include members that may, alone or in combination, perform specified operations when operating. In an example, hardware of the circuit set may be immutably designed to carry out a specific operation (e.g., hardwired). In an example, the hardware of the circuit set may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions can enable embedded hardware (e.g., the execution units or a loading mechanism) to create members of the circuit set in hardware via the variable connections to carry out portions of the specific operation when in operation. Accordingly, the computer readable medium is communicatively coupled to the other components of the circuit set member when the device is operating. In an example, any of the physical components may be used in more than one member of more than one circuit set. For example, under operation, execution units may be used in a first circuit of a first circuit set at one point in time and reused by a second circuit in the first circuit set, or by a third circuit in a second circuit set at a different time.

Particular implementations of the systems and methods described herein may involve use of a machine (e.g., computer system) that may include a hardware processor (e.g., a central processing unit (CPU), a graphics processing unit (GPU), a hardware processor core, or any combination thereof), a main memory and a static memory, some or all of which may communicate with each other via an interlink (e.g., bus). The machine may further include a display unit, an alphanumeric input device (e.g., a keyboard), and a user interface (UI) navigation device (e.g., a mouse). In an example, the display unit, input device and UI navigation device may be a touch screen display. The machine may additionally include a storage device (e.g., drive unit), a signal generation device (e.g., a speaker), a network interface device, and one or more sensors, such as a global positioning system (GPS) sensor, compass, accelerometer, or other sensor. The machine may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device may include a machine readable medium on which is stored one or more sets of data structures or instructions (e.g., software) embodying or utilized by any one or more of the techniques or functions described herein. The instructions may also reside, completely or at least partially, within the main memory, within static memory, or within the hardware processor during execution thereof by the machine. In an example, one or any combination of the hardware processor, the main memory, the static memory, or the storage device may constitute machine readable media.

While the machine readable medium can include a single medium, the term "machine readable medium" may include a single medium or multiple media (e.g., a centralized or distributed database, and/or associated caches and servers) configured to store the one or more instructions.

The term "machine readable medium" may include any medium that is capable of storing, encoding, or carrying instructions for execution by the machine and that cause the machine to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions may further be transmitted or received over a communications network using a transmission medium via the network interface device utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device may include one or more physical jacks (e.g., Ethernet, coaxial, or phone jacks) or one or more antennas to connect to the communications network. In an example, the network interface device may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine, and includes digital or analog communications signals or other intangible medium to facilitate communication of such software.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A digital predistortion circuit to generate a predistorted signal for providing to a power amplifier, the digital predistortion circuit comprising:
   an interpolator circuit configured to generate an interpolated complex baseband signal based at least in part on a complex baseband signal received from a digital upconverter, wherein the interpolated baseband signal has a sampling frequency higher than a sampling frequency of the complex baseband signal;
   a complex-to-real circuit configured to generate a real mode signal based at least in part on the interpolated complex baseband signal; and
   a real mode digital predistortion circuit configured to generate a predistorted signal based at least in part on the real mode signal.

2. The digital predistortion circuit of claim 1, further comprising a digital upconverter to generate the complex baseband signal.

3. The digital predistortion circuit of claim 1, further comprising an upcoverter configured to generate a translated complex signal based at least in part on the complex baseband signal, wherein the translated complex signal is at a carrier frequency higher than a baseband frequency of the complex baseband signal, and wherein the real mode signal is also based at least in part on the translated complex signal.

4. The digital predistortion circuit of claim 1, wherein the complex-to-real circuit is configured to generate the real mode signal at a carrier frequency higher than a baseband frequency of the complex baseband signal.

5. The digital predistortion circuit of claim 1, wherein the real mode digital predistortion circuit is also configured to perform operations comprising:
   determining a real component based at least in part on the complex baseband signal;
   determining a first value for the real component at a first time; and
   selecting from a first nonlinear look up table (LUT) a first LUT value based at least in part on the first value for the real component, wherein the first LUT value is a based at least in part on a sum of terms omitting a first order term.

6. The digital predistortion circuit of claim 5, wherein the real mode digital predistortion circuit is also configured to perform operations comprising:
   selecting from a second LUT a second LUT value based at least in part on a second value for the real component at a second time before the first time; and
   determining a sum of the first LUT value and the second LUT value, wherein the predistorted signal is based at least in part on the sum.

7. The digital predistortion circuit of claim 1, wherein the real mode digital predistortion circuit is also configured to perform operations comprising:
   determining a real component based at least in part on the complex baseband signal;
   determining a first value for the real component at a first time;
   determining $I^{th}$ an order power of the first value;
   applying an $I^{th}$ order tap coefficient to the $I^{th}$ order power of the first value to generate an $I^{th}$ order tap value;
   determining a $J^{th}$ order power of the first value; and
   applying a $J^{th}$ order tap coefficient to the $J^{th}$ order power of the first value to generate a $J^{th}$ order tap value, wherein a nonlinear component of the predistorted signal is based at least in part a sum of the $I^{th}$ order tap value and the $J^{th}$ order tap value.

8. The digital predistortion circuit of claim 1, further comprising a tilt reference filter circuit programmed to perform operations comprising applying a highpass frequency gain characteristic to a real component of the complex baseband signal to generate a tilt reference real component, wherein the real mode digital predistortion circuit is also programmed to perform operations comprising determining a tilt reference predistorted signal based at least in part on the tilt reference real component.

9. A method of generating a predistorted signal for providing to a power amplifier, comprising:
   generating an interpolated complex baseband signal based at least in part on a complex baseband signal, wherein the interpolated baseband signal has a sampling frequency higher than a sampling frequency of the complex baseband signal;
   generating a real mode signal based at least in part on the interpolated complex baseband signal; and
   generating a predistorted signal based at least in part on the real mode signal.

10. The method of claim 9, further comprising generating the complex baseband signal.

11. The method of claim 9, further comprising generating a translated complex signal based at least in part on the complex baseband signal, wherein the translated complex signal is at a carrier frequency higher than a baseband frequency of the complex baseband signal, and wherein the real mode signal is also based at least in part on the translated complex signal.

12. The method of claim 9, further comprising generating the real mode signal at a carrier frequency higher than a baseband frequency of the complex baseband signal.

13. The method of claim 9, further comprising:
   determining a real component based at least in part on the complex baseband signal;
   determining a first value for the real component at a first time; and
   selecting from a first nonlinear look up table (LUT) a first LUT value based at least in part on the first value for the real component, wherein the first LUT value is a based at least in part on a sum of terms omitting a first order term.

14. The method of claim 13, further comprising:
   selecting from a second a second LUT value based at least in part on a second value for the real component at a second time before the first time; and
   determining a sum of the first LUT value and the second LUT value, wherein the predistorted signal is based at least in part on the sum.

15. The method of claim 9, further comprising:
   determining a real component based at least in part on the complex baseband signal;
   determining a first value for the real component at a first time;
   determining an $I^{th}$ order power of the first value;
   applying an $I^{th}$ order tap coefficient to the $J^{th}$ order power of the first value to generate an $I^{th}$ order tap value;
   determining a $J^{th}$ order power of the first value; and
   applying a $J^{th}$ order tap coefficient to the $J^{th}$ order power of the first value to generate a $J^{th}$ order tap value, wherein a nonlinear component of the predistorted signal is based at least in part a sum of the $I^{th}$ order tap value and the $J^{th}$ order tap value.

16. The method of claim 9, further comprising:
   applying a highpass frequency gain characteristic to a real component of the complex baseband signal to generate a tilt reference real component; and
   determining a tilt reference predistorted signal based at least in part on the tilt reference real component.

17. A system for generating a predistorted signal for providing to a power amplifier, comprising:
   means for generating an interpolated complex baseband signal based at least in part on a complex baseband signal, wherein the interpolated baseband signal has a sampling frequency higher than a sampling frequency of the complex baseband signal;
   means for generating a real mode signal based at least in part on the interpolated complex baseband signal; and
   means for generating a predistorted signal based at least in part on the real mode signal.

18. The system of claim 17, further comprising means for generating the complex baseband signal.

19. The system of claim 17, further comprising means for generating a translated complex signal based at least in part on the complex baseband signal, wherein the translated complex signal is at a carrier frequency higher than a baseband frequency of the complex baseband signal, and wherein the real mode signal is also based at least in part on the translated complex signal.

20. The system of claim 17, further comprising means for generating the real mode signal at a carrier frequency higher than a baseband frequency of the complex baseband signal.

* * * * *